(12) United States Patent
Vesma et al.

(10) Patent No.: US 8,209,586 B2
(45) Date of Patent: Jun. 26, 2012

(54) BURST TRANSMISSION IN A DIGITAL BROADCASTING NETWORK

(75) Inventors: Jussi Vesma, Turku (FI); Harri Pekonen, Raisio (FI)

(73) Assignee: Nokia Corporation, Espoo (FI)

( * ) Notice: Subject to any disclaimer, the term of this patent is extended or adjusted under 35 U.S.C. 154(b) by 1049 days.

(21) Appl. No.: 11/662,967

(22) PCT Filed: Aug. 12, 2005

(86) PCT No.: PCT/IB2005/052677
§ 371 (c)(1),
(2), (4) Date: Mar. 15, 2007

(87) PCT Pub. No.: WO2006/030329
PCT Pub. Date: Mar. 23, 2006

(65) Prior Publication Data
US 2007/0277077 A1    Nov. 29, 2007

(30) Foreign Application Priority Data
Sep. 15, 2004  (GB) ................... 0420540.7

(51) Int. Cl.
*H03M 13/00* (2006.01)
(52) U.S. Cl. .......... 714/762; 714/788; 714/777
(58) Field of Classification Search .......... 714/762, 714/788, 777
See application file for complete search history.

(56) References Cited

U.S. PATENT DOCUMENTS

| | | | |
|---|---|---|---|
| 5,371,734 A | 12/1994 | Fischer | |
| 5,382,949 A | 1/1995 | Mock et al. | |
| 5,923,655 A | 7/1999 | Veschi et al. | |
| 6,035,434 A | 3/2000 | Sazzad et al. | |
| 6,101,465 A | 8/2000 | Sazzad et al. | |
| 6,175,557 B1 | 1/2001 | Diachina et al. | |
| 6,441,782 B2 | 8/2002 | Kelly et al. | |
| 6,477,382 B1 | 11/2002 | Mansfield et al. | |
| 6,615,381 B1 | 9/2003 | Fukada et al. | |
| 6,731,615 B1 | 5/2004 | Bousquet et al. | |
| 6,839,332 B1 | 1/2005 | Agarwal et al. | |
| 7,230,978 B2 | 6/2007 | Bitterlich et al. | |
| 2002/0023270 A1 | 2/2002 | Thomas et al. | |
| 2002/0075827 A1 | 6/2002 | Balogh et al. | |
| 2002/0105976 A1 | 8/2002 | Kelly et al. | |
| 2003/0002499 A1 | 1/2003 | Cummings et al. | |
| 2003/0152107 A1 | 8/2003 | Pekonen | |

(Continued)

FOREIGN PATENT DOCUMENTS
GB    2401759    11/2004
(Continued)

OTHER PUBLICATIONS

Canadian Office Action issued in parallel Application No. 2,580,396 dated Feb. 2, 2010, 3 pages.

(Continued)

*Primary Examiner* — Guy Lamarre
(74) *Attorney, Agent, or Firm* — Banner & Witcoff

(57) ABSTRACT

A multiprotocol encapsulation forward error correction (MPE-FEC) frame comprising datagrams and FEC data is shown wherein an MPE encapsulator places datagrams in MPE sections and FEC data in MPE-FEC sections. A time slicing block forms a sequence of bursts and dividing the MPE-FEC frame between bursts, such that MPE sections are sent in at least two bursts. The time slicing block adds a burst number parameter to headers of the MPE and MPE-FEC sections to enable a terminal to determine whether to expect further bursts carrying data from the MPE-FEC frame.

29 Claims, 29 Drawing Sheets

U.S. PATENT DOCUMENTS

| | | | |
|---|---|---|---|
| 2004/0063399 | A1 | 4/2004 | Milbar |
| 2006/0245488 | A1 | 11/2006 | Puputti et al. |
| 2006/0258324 | A1 | 11/2006 | Vare et al. |
| 2007/0074264 | A1 | 3/2007 | Vesma et al. |
| 2007/0101228 | A1 | 5/2007 | Vesma et al. |
| 2007/0101288 | A1 | 5/2007 | Forstall et al. |

FOREIGN PATENT DOCUMENTS

| | | |
|---|---|---|
| GB | 2402307 | 12/2004 |
| GB | 2406488 | 3/2005 |
| JP | 4-290316 | 10/1992 |
| JP | 07170246 | 7/1995 |
| JP | 9-214473 | 8/1997 |
| JP | 11355854 | 12/1999 |
| JP | 2004088388 | 3/2004 |
| WO | 9900931 | 1/1999 |
| WO | 02080590 | 10/2002 |
| WO | 02082834 | 10/2002 |
| WO | 03001338 | 1/2003 |
| WO | 03069885 | 8/2003 |
| WO | 2004066652 | 8/2004 |
| WO | 2004102964 | 11/2004 |
| WO | 2004107619 | 12/2004 |

OTHER PUBLICATIONS

Japanese Office Action dispatched Apr. 26, 2010 in corresponding Japanese Patent Application No. 2007-531880 (2 pages) together with English translation thereof (2 pages).

Michael Kornfield, "DVB-H—The emerging standard for mobile datacommunication," Consumer Electronics, IEEE International Symposium on, Sep. 3, 2004, pp. 193-198 (7 pages).

"Digital Video Broadcasting (DVB); DVB specification for data broadcasting," ETSI EN 301 192 V1.4.1, Aug. 2004 (23 pages).

English Abstract of Japanese patent laid-open publication No. H07-170246, Error control transmitter and error control receiver for transmission frame, and transmitting and receiving method for transmission frame with error correcting code, Mitsubishi Electric Corp., published Jul. 4, 1995 (1 page).

English Abstract of Japanese patent laid-open publication No. H11-355854, Digital data transmission reception method, base station device used for transmission/reception of digital data and mobile terminal used for transmission/reception of digital data, Matsushita Electric Ind. Co. LTD., published Sep. 24, 1999 (1 page).

English Abstract of Japanese Patent Application No. 2004088388, Receiver, method for processing received data, and program, NTT Data Corp., published Mar. 18, 2004, (1 page).

English translation of Japanese Office Action dispatched Oct. 12, 2010 in corresponding Japanese Patent Application No. 2007-531880 (2 pages).

English Abstract of Japanese Patent Publication No. JP9214473, published Aug. 15, 1997 (1 page).

English Abstract of Japanese Patent Publication No. JP4290316, published Oct. 14, 1992 (1 page).

DVB Organization: "tm2896.complete.pdf", DVB-X: Concept 1 System Description, Version 0.4, Dec. 6, 2003; DVB, Digital Video Broadcasting, C/O EBU—17A Ancienne Route—CH-1218 Grand Saconnex, Geneva, Switzerland, Oct. 3, 2003, XP017800820, (part 1-80 pages; part 2-82 pages; part 3-36 pages for a total of 198 pages).

Jani Vare et al., "Soft Handover in Terrestrial Broadcast Networks", 2004 IEEE International Conference on Mobile Data Management, Jan. 2004 (7 pages).

Hu et al., "A comparison of indexing methods for data broadcast on the air", ICOIN-12 Proceedings, Tokyo, Japan, Jan. 21-23, 1998 (4 pages).

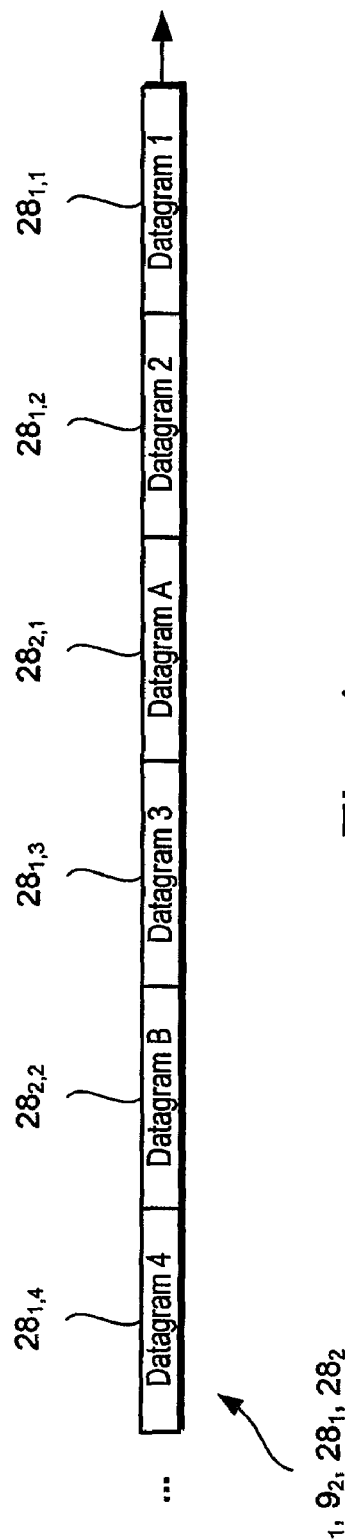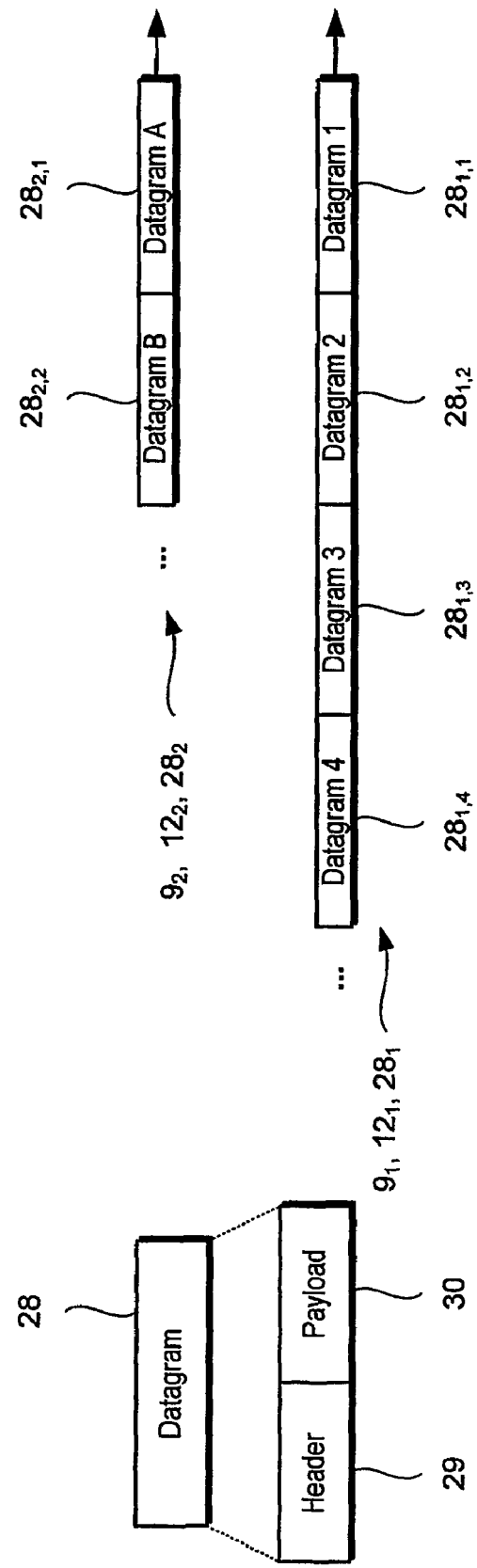

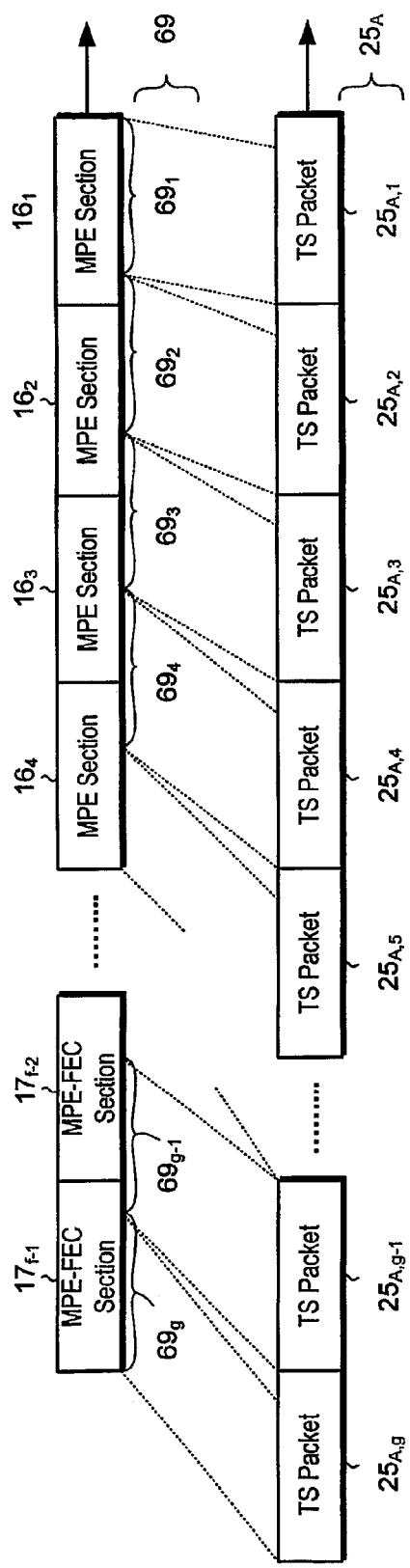
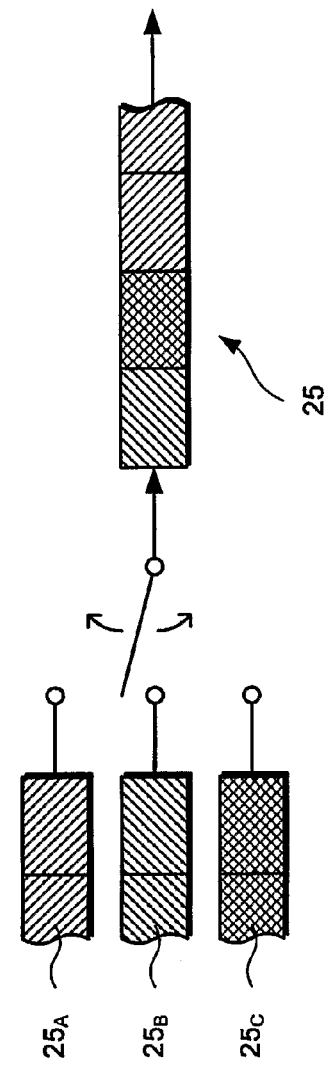
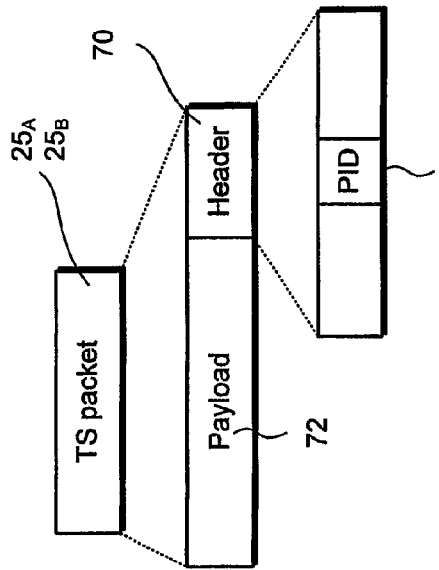
Fig. 25
Fig. 27
Fig. 26

BURST TRANSMISSION IN A DIGITAL BROADCASTING NETWORK

CROSS REFERENCE TO RELATED APPLICATIONS

This application is the U.S. National Stage of International Application Number PCT/IB2005/052677 filed Aug. 12, 2005 which was published in English Mar. 23, 2006 under International Publication Number WO 2006/030329 A1 and which claims priority from Great Britain application 0420540 filed Sep. 15, 2004.

BACKGROUND OF THE INVENTION

1. Technical Field

The present invention relates to a method of transmitting bursts in a digital broadcasting network, particularly, but not exclusively, to a method of transmitting bursts in a digital video broadcasting (DVB) network.

The present invention also relates to a network element for preparing bursts to be transmitted in a digital broadcasting network, particularly, but not exclusively, to a multiprotocol encapsulator (MPE) for use in a DVB network.

The present invention further relates to a terminal for receiving data from a digital broadcasting network, particularly, but not exclusively to a mobile, handheld terminal for receiving data from a DVB network

2. Discussion of Related Art

ETSI EN 302 304 "Digital Video Broadcasting (DVB); Transmission System for Handheld Terminals (DVB-H)" V1.1.1 (2004-06) specifies a system for delivering multimedia services via DVB networks to mobile, handheld terminals. The system is based on DVB data broadcasting specified in ETSI EN 301 192 "Digital Video Broadcasting (DVB); DVB Specification for data broadcasting" V1.4.1 (2004-06).

In DVB data broadcasting, data is delivered to a terminal in datagrams, which are placed in sections using Multi-Protocol Encapsulation (MPE). MPE sections in turn are mapped into MPEG-2 Transport Stream (TS) packets in accordance with ISO/IEC Standard 13818-1 "Information Technology-Generic coding of moving pictures and associated audio information: Systems" for transmission.

It is more difficult to receive data at a mobile, battery-powered terminal, than it is to a static, mains-powered terminal. For example, mobile reception is particularly prone to impulse noise. Furthermore, terminal battery power is limited.

DVB-H employs forward error correction (FEC) to provide robustness against noise and uses time slicing to allow a terminal to conserve battery life.

Data and associated FEC parity data may be prepared in a data frame known as an MPE-FEC frame and reference is made to Clause 9.3 in EN 302 304 ibid.

A conventional MPE-FEC frame is arranged as a matrix with 255 columns and a flexible number of rows. The number of rows is signaled in service information (SI) and can have a value of up to 1024. Each position in the matrix holds a byte of data and so an MPE-FEC frame can hold up to almost 2 Mbits of data.

The left part of the MPE-FEC frame, consisting of the 191 leftmost columns, is dedicated to OSI layer 3 (in other words, Network layer) datagrams, such as Internet Protocol (IP) datagrams, and possible padding, and is called the application data table. The right part of the MPE-FEC frame, consisting of the 64 rightmost columns, is dedicated for the parity information of the FEC code and is called the RS data table. Each byte position in the application data table has an address ranging from 0 to 191×no_of_rows−1. Similarly, each byte position in the RS data table has an address ranging from 0 to 64×no_of_rows−1.

Layer 3 datagrams are introduced datagram-by-datagram, starting with the first byte of the first datagram in the upper left corner of the matrix and going downwards to the first column. The length of the datagrams may vary arbitrarily from datagram to datagram. Immediately after the end of one datagram, the following datagram starts. If a datagram does not end precisely at the end of a column, it continues at the top of the following column. When all datagrams have entered the application data table any unfilled byte positions are padded with zero bytes, which makes the leftmost 191 columns completely filled.

With all the leftmost 191 columns filled it is now possible, for each row, to calculate the 64 parity bytes from the 191 bytes of data and possible padding. The code used is Reed-Solomon RS (255,191,64). Each row then contains one RS codeword. Some of the rightmost columns of the RS data table may be discarded and hence not transmitted, to enable puncturing. The exact number of punctured RS columns does not need to be explicitly signaled and may change dynamically between frames. Thus, the RS data table is filled and the MPE-FEC frame is completed.

IP datagrams are mapped into MPE sections and RS columns are mapped into MPE-FEC sections.

The datagrams are carried in MPE sections in compliance with the DVB standard, irrespective of whether MPE-FEC is being used. This makes reception fully backwards compatible with MPE-FEC ignorant receivers. Each section carries a start address for the payload in the section header. This address indicates the byte position in the application data table of the first byte of the section payload. In case the datagram is divided over multiple MPE sections, each MPE section indicates the byte position in the application data table of the first byte of the datagram fragment carried within the section. The receiver will then be able to put the received datagram in the right byte positions in the application data table and mark these positions as "reliable" for the RS decoder, provided the section CRC-32 check shows that the section is correct.

The last section of the application data table contains a table boundary flag, which indicates the end of the datagrams within the application data table. If all previous sections within the application data table have been received correctly the receiver does not need to receive any MPE-FEC sections and, if time slicing is used, the receiver can be switched off without receiving and decoding RS data. If MPE-FEC sections are also received, the number of padding columns (columns filled with padding bytes only) in the application data table is indicated with 8 bits in the section header of the MPE-FEC sections; this value is used if RS decoding is performed.

RS columns are carried in MPE-FEC sections. Each section carries exactly one column of the RS data table. Punctured columns are not transmitted and not signalled explicitly.

Data can be transmitted in time-slicing bursts and reference is made to Clause 9.2 in EN 302 304 ibid.

Time slicing involves sending data in bursts using significantly higher bit-rate compared to the bit-rate required if the data was transmitted using conventional bandwidth management. Within a burst, the time before the start of the next burst (delta-t) is indicated. Between the bursts, data of the elementary stream is not transmitted, allowing other elementary streams to use the bandwidth otherwise allocated. This enables a receiver to stay active only for a fragment of the time, while receiving bursts of a requested service.

Conventionally, the contents of one MPE-FEC frame is transmitted in one time-sliced burst. However, this arrangement suffers at least two drawbacks.

Firstly, the interleaving length of the application data and RS data is short and so the burst is still prone to noise. One solution is to lengthen the duration of the burst. However, this reduces the benefit of time slicing.

Secondly, if a burst carries data for more than one service, then the same level of error protection is used.

SUMMARY OF THE INVENTION

The present invention seeks to provide a method of transmitting bursts in a digital broadcasting network, a network element for preparing bursts for transmission in a digital broadcasting network and/or a terminal for receiving bursts from a digital broadcasting network.

According to a first aspect of the present invention there is provided a method of transmitting bursts in a digital broadcasting network, the method comprising providing a first data frame, the data frame comprising a first set of data and a corresponding first set of forward error correction (FEC) data, forming a sequence of bursts and dividing the first data frame between said bursts, the first set of data being divided between at least two bursts. Thus, the interleaving length of the data frame can be increased.

At least one burst may not include FEC data.

The method may further comprise providing a second data frame, the second data frame comprising a second set of data and a corresponding second set of FEC data, and dividing the second data and the second set of FEC data in the second data frame between the plurality of bursts. The method may comprise dividing the first data frame into a first set of data frame blocks, dividing the second data frame into a second set of data frame blocks, interleaving the first and second sets of data frame blocks and sequentially placing the interleaved data frame blocks into the plurality of bursts.

According to a second aspect of the present invention there is provided a method of transmitting bursts in a digital broadcasting network, the method comprising providing a first data frame, said first data frame comprising a first set of data and a corresponding first set of forward error correction (FEC) data, providing a second data frame, said second data frame comprising a second set of data and a corresponding second set of FEC data and forming a burst comprising said first and second data frames. Thus, if it is desired to transmit the first and second sets of data with different levels of forward error correction, they can still be transmitted in the same burst.

The method may further comprise providing each data frame with a respective label for identifying an origin of the data. The method may further comprise providing each data frame with a respective label for locating the data frame in a sequence of data frames. The method may further comprise providing each burst with a respective label for identifying the burst within a sequence of bursts. Providing the first data frame may comprise providing a first array comprising first and second portions, filling at least a part of the first array-portion with the first set of data, determining the first set of FEC data in dependence upon data in the first array-portion and placing said first set of FEC data in the second array-portion.

The method may comprise encapsulating the first set of data into a first set of multiprotocol encapsulation (MPE) sections and encapsulating said corresponding FEC data into a second set of MPE sections. Forming said plurality of bursts may comprise arranging said first and second sets of MPE sections temporally-offset groups. The first data frame may be a multiprotocol encapsulation-forward error correction (MPE-FEC) frame.

The digital broadcasting network may be a digital video broadcasting network.

According to a third aspect of the present invention there is provided a method of operating a terminal for receiving bursts from a digital broadcasting network, the method comprising receiving a first burst, said burst including data for a data frame, placing said data in a data frame, extracting, from said first burst, an indication that a second burst in a sequence of bursts which includes said first burst will follow, receiving said second burst, said second burst including further data for said data frame and placing said further data in said data frame.

According to a fourth aspect of the present invention there is provided a method of operating a terminal for receiving bursts from a digital broadcasting network, the method comprising receiving a burst, said burst including data for a plurality of data frames, extracting sets of data from said burst together with indications to which data frame said sets of data belong and placing each set of data in a corresponding data frame.

According to a fifth aspect of the present invention there is provided a computer program comprising instructions for causing data processing apparatus to provide a first data frame, the data frame comprising a first set of data and a corresponding first set of forward error correction (FEC) data, to form a sequence of bursts and divide the first data frame between said bursts, the first set of data being divided between at least two bursts.

According to a sixth aspect of the present invention there is provided a computer program comprising instructions for causing data processing apparatus to provide a first data frame, said first data frame comprising a first set of data and a corresponding first set of forward error correction (FEC) data, to provide a second data frame, said second data frame comprising a second set of data and a corresponding second set of FEC data and to form a burst comprising said first and second data frames.

According to a seventh aspect of the present invention there is provided a computer program comprising instructions for causing data processing apparatus to receive a first burst, said burst including data for a data frame; to place said data in a data frame; to extract, from said first burst, an indication that a second burst in a sequence of bursts which includes said first burst follow, to receive said second burst, said second burst including further data for said data frame and to place said further data in said data frame.

According to an eighth aspect of the present invention there is provided a computer program comprising instructions for causing data processing apparatus to receive a burst, said burst including data for a plurality of data frames, to extract data from said burst together with indication to which data frame a set of data belong and to place said set of data in a corresponding data frame The computer program may be stored on a data carrier or in memory.

According to an ninth aspect of the present invention there is provided a system for transmitting bursts in a digital broadcasting network comprising providing a first data frame, the data frame comprising a first set of data and a corresponding first set of forward error correction (FEC) data forming a sequence of bursts and dividing the first data frame between said bursts, the first set of data being divided between at least two bursts.

According to an tenth aspect of the present invention there is provided a system for transmitting bursts in a digital broadcasting network comprising providing a first data frame, said first data frame comprising a first set of data and a corresponding first set of forward error correction (FEC) data, providing a second data frame, said second data frame comprising a second set of data and a corresponding second set of FEC data and forming a burst comprising said first and second data frames.

According to an eleventh aspect of the present invention there is provided a network element configured to provide a first data frame, the data frame comprising a first set of data and a corresponding first set of forward error correction (FEC) data, to form a sequence of bursts and divide the first data frame between said bursts, the first set of data being divided between at least two bursts.

According to a twelfth aspect of the present invention there is provided a network element configured to provide a first data frame, said first data frame comprising a first set of data and a corresponding first set of forward error correction (FEC) data, to provide a second data frame, said second data frame comprising a second set of data and corresponding second set of FEC data and to form a burst comprising said first and second data frames.

The network element may be a multiprotocol encapsulation (MPE) encapsulator.

According to a thirteenth aspect of the present invention there is provided a terminal for receiving bursts from a digital broadcasting network, the terminal configured to receive a first burst, said burst including data for a data frame, to place said data in a data frame, to extract, from said first burst, an indication that a second burst in a sequence of bursts which includes said first burst follow, to receive said second burst, said second burst including further data for said data frame and to place said further data in said data frame.

According to a fourteenth aspect of the present invention there is provided a terminal for receiving bursts from a digital broadcasting network, the terminal configured to receive a burst, said burst including data for a plurality of data frames, to extract sets of data from said burst together with indications to which data frame said sets of data belong and to place said set of data in a corresponding data frame.

BRIEF DESCRIPTION OF THE DRAWINGS

Embodiments of the present invention will now be described, by way of example, with reference to the accompanying twenty-nine sheets of drawings in which:

FIG. 4 illustrates an example of a set of internet protocol (IP) streams;

FIG. 5 is a simplified schematic diagram of an IP datagram;

FIG. 6 illustrates IP streams filtered from the IP streams shown in FIG. 4;

FIG. 25 illustrates encapsulation of section fragments into transport stream (TS) packets;

FIG. 26 is a schematic diagram of a TS packet;

FIG. 27 illustrates multiplexing TS packets;

DETAILED DESCRIPTION OF THE INVENTION

Digital Broadcasting Network 1

Figure 1:
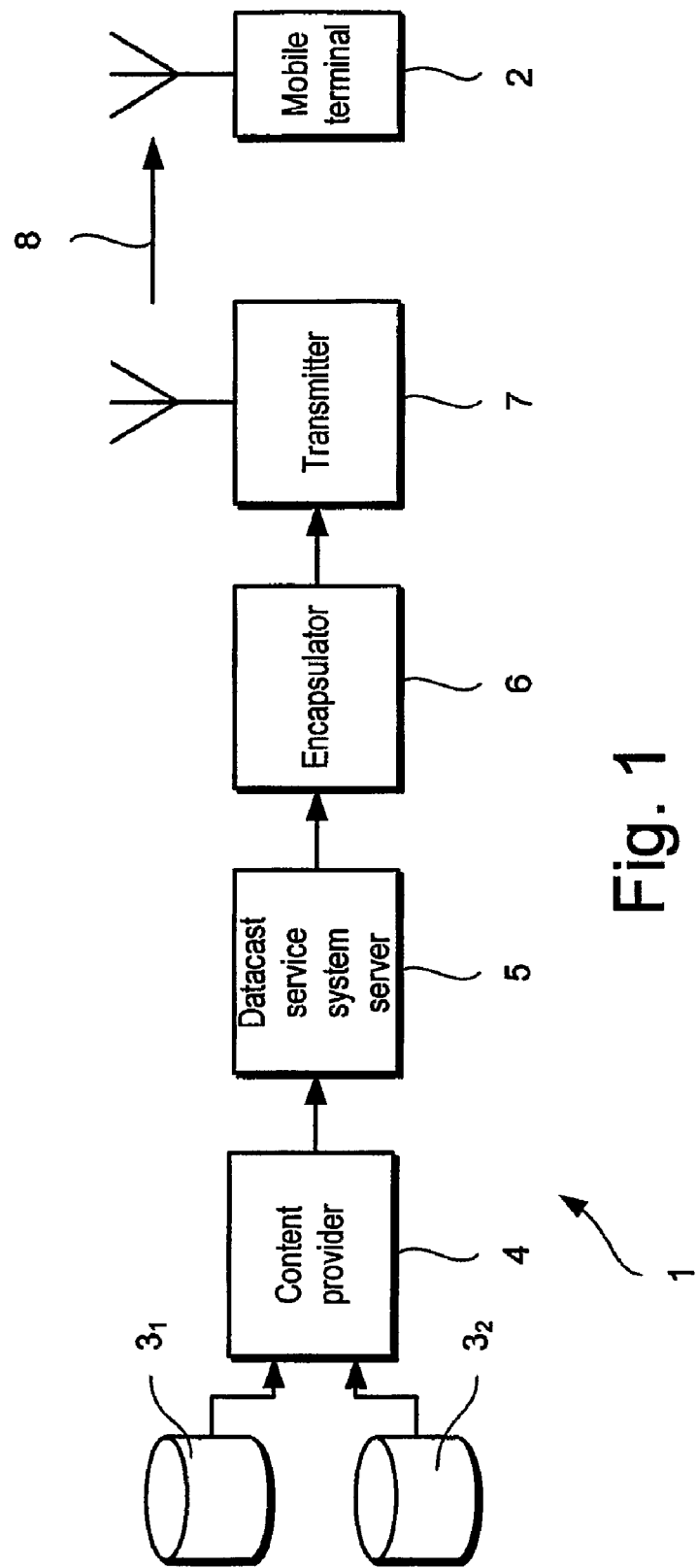
FIG. 1 is a schematic diagram of an embodiment of a digital broadcasting network and an embodiment of handheld terminal according to the present invention.

Referring to FIG. 1, a communications network 1 for delivering content to a mobile terminal 2 in accordance with the present invention is shown. The communications network 1 includes a handheld digital video broadcasting (DVB-H) network which is used as a broadcast access network to deliver content as an Internet Protocol Data Casting (IPDC) service. However, other digital broadcast networks may be used including other types of DVB network, such as a terrestrial DVB (DVB-T) network, a cable DVB (DVB-C) network or a satellite DVB (DVB-S) network, a Digital Audio Broadcasting (DAB) network, an Advance Television System Committee (ATSC) network, a terrestrial Integrated Services Digital Broadcasting-Terrestrial (ISDB-T) network and other networks which are similar to or based on such networks.

The network 1 includes sources $3_1$, $3_2$ of content, for example in the form of video, audio and data files, a content provider 4 for retrieving, re-formatting and storing content, a datacast service system server 5 for determining service composition, a multi-protocol encapsulation (MPE) encapsulator 6 and a transmitter 7 for modulating and broadcasting a signal 8 to receivers (not shown) including mobile terminal 2.

Other network elements may be provided, such as one or more gap-filler transmitters (not shown) for receiving and re-transmitting the signal 8. Furthermore, a communications network (not shown), such as a public land mobile network preferably in the form a $2^{nd}$ or $3^{rd}$ generation mobile network such as GSM or UMTS respectively, may be provided for providing a return channel from the mobile terminal 2 to the digital broadcasting network 1. A further communications network (not shown), such as the Internet, may be provided to connect distributed elements of the digital broadcasting network 1, such as content provider 4 and service system server 5.

MPE Encapsulator 6

Figure 2:
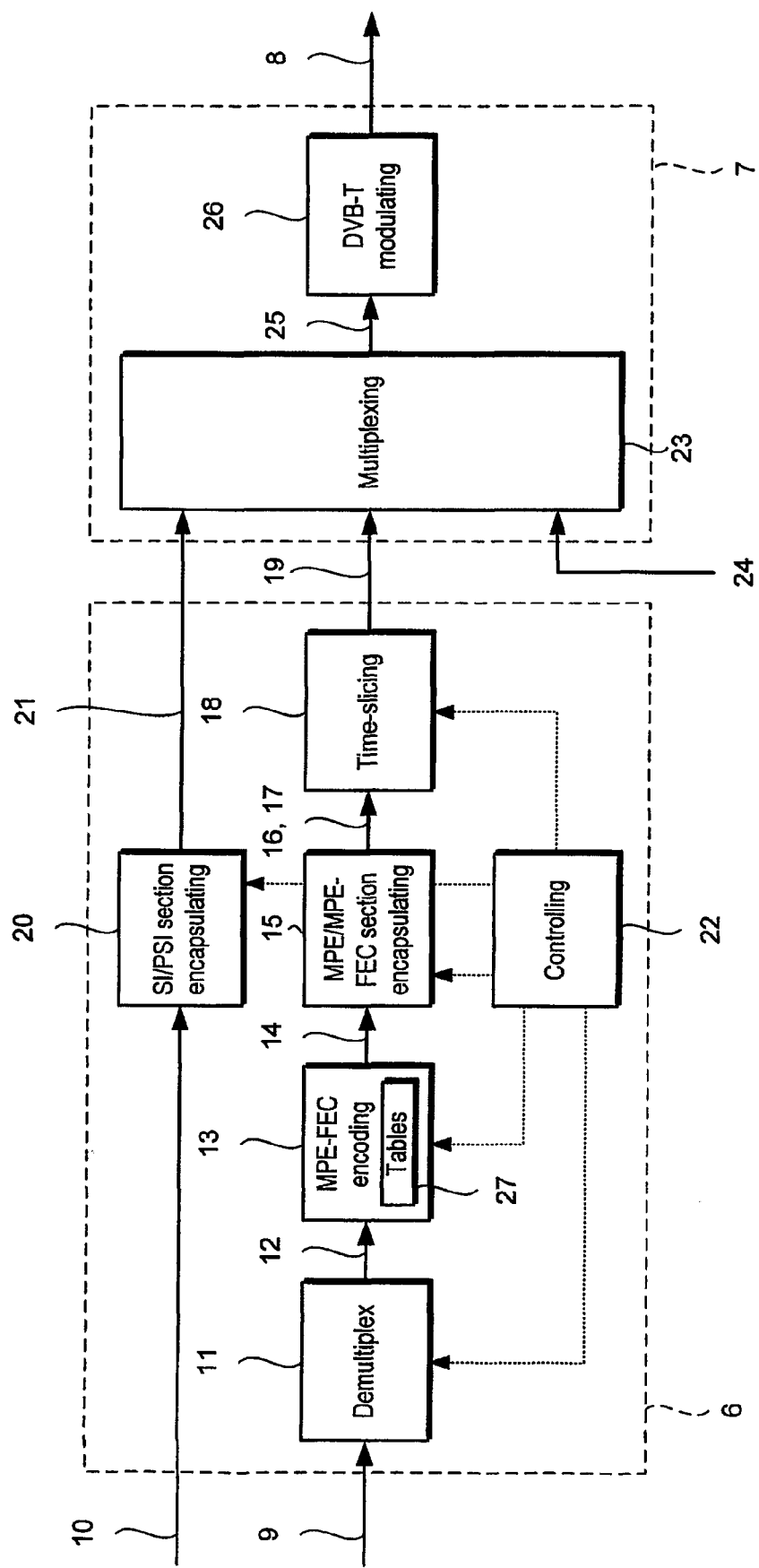
FIG. 2 is a functional block diagram of an embodiment of a multiprotocol encapsulator (MPE) according to the present invention and a transmitter.
Figure 3A:
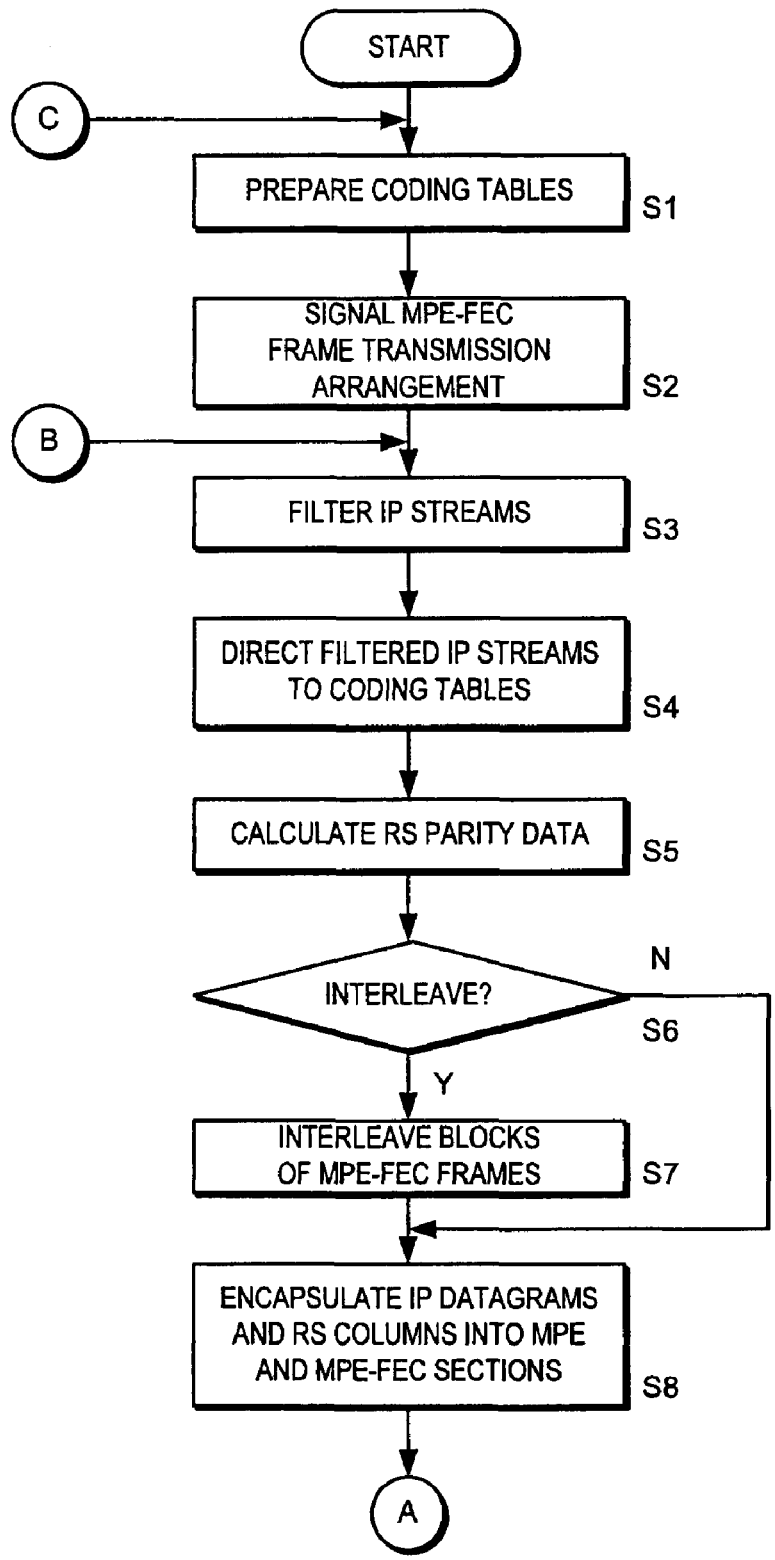
FIG. 3A and FIG. 3B show a process flow diagram of a method of operating the multiprotocol encapsulator (MPE) shown in FIG. 2.
Figure 3B:
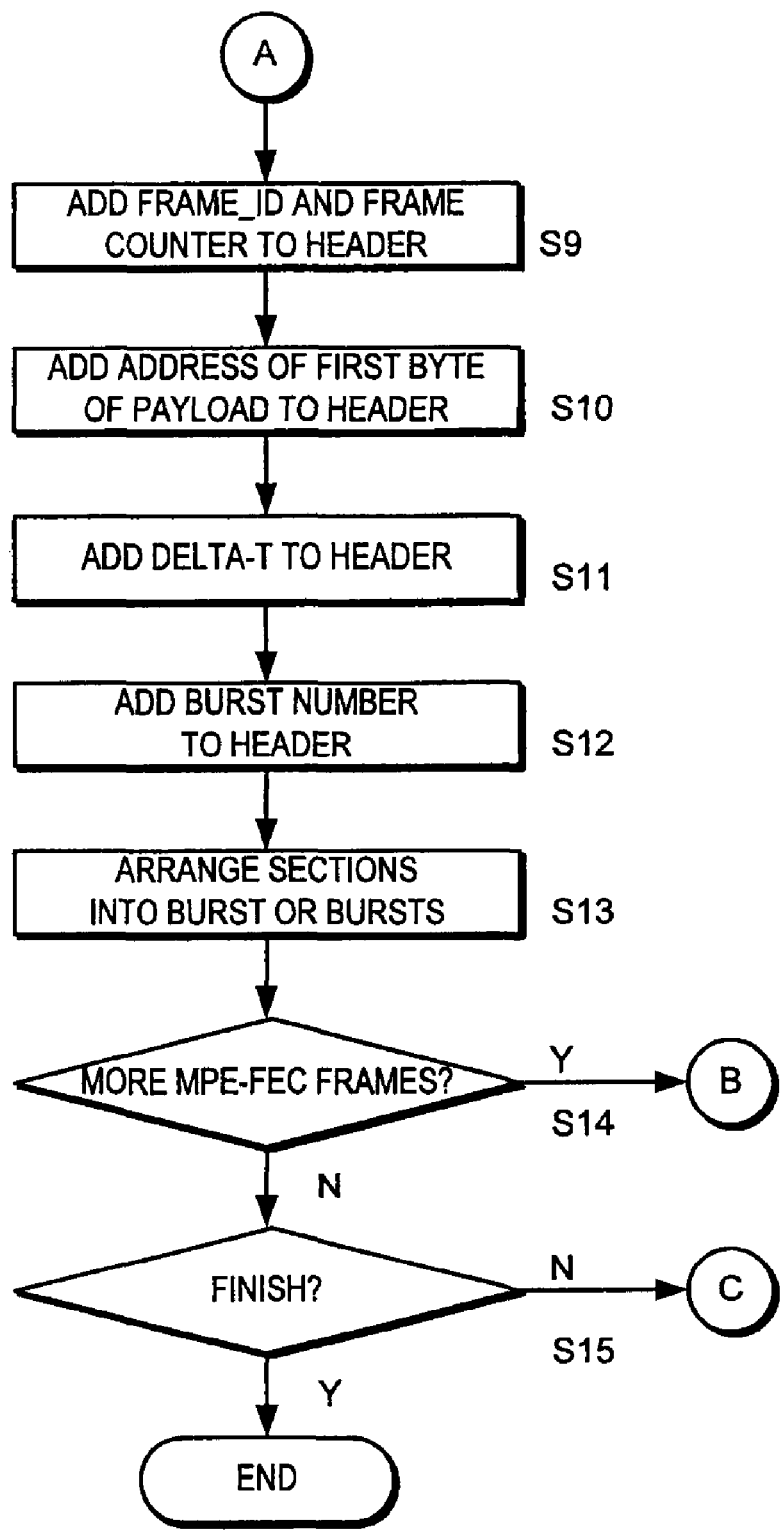

Referring to FIG. 2, a functional block diagram of the MPE encapsulator 6 and transmitter 7 is shown.

The MPE encapsulator 6 receives content in the form of a plurality of internet protocol (IP) streams 9 having different IP addresses and service information data 10 which is used to create MPEG program specific information (PSI) and DVB service information (SI).

The MPE encapsulator 6 comprises an IP demultiplexing block 11 for filtering one or more desired IP streams and arranging the filtered IP streams into one or more filtered streams 12. Each filtered stream 12 may comprise one or more IP streams. The demultiplexing block 11 forwards the filtered stream 12 to an encoding block 13.

The MPE encapsulator 6 comprises an encoding block 13 for providing forward error correction (FEC) for the filtered streams 12. The encoding block 13 prepares and forwards MPE-FEC frames 14. If FEC is not used for a given filtered stream 12, then the encoder 13 does not perform encoding, but simply buffers the stream 12. The encoder 13 may also perform interleaving as will be described in more detail later.

The MPE encapsulator 6 further comprises an MPE/MPE-FEC section encapsulating block 15 for mapping data comprised in MPE-FEC frames 14 into MPE sections 16 and MPE-FEC sections 17. Reference is made to ETSI EN 301 192 "Digital Video Broadcasting (DVB); DVB Specification for data broadcasting" V1.4.1 (2004-06).

The MPE encapsulator 6 also comprises a time slicing block 18 for time-slicing the MPE sections 16 and MPE-FEC sections 17 into bursts 19. As will be explained in more detail later, the MPE encapsulator 6 can transmit data from one MPE-FEC frame 14 in more than one burst 19 and/or transmit data from more than one MPE-FEC frame 14 in one burst 19 in accordance with the present invention. The MPE encapsulator 6 can also transmit one MPE-FEC frame 14 in one burst 19 in a conventional way, but this will not be described here in detail.

The MPE encapsulator 6 also comprises an SI/PSI section encapsulating block 20 for mapping SI tables into sections 21 in accordance with ETSI EN 300 468 "Digital Video Broadcasting (DVB); Specification for Service Information (SI) in DVB systems" V1.6.1 (2004-6).

The MPE encapsulator 6 also comprises a controlling block 22 for managing other elements of the encapsulator shown in FIG. 2.

The functions of the MPE encapsulator 6 may be implemented by a computer (not shown) running a computer program (not shown).

The transmitter 7 includes a transport stream (TS) generating and multiplexing block 23. The TS generating and multiplexing block 23 divides MPE sections 16 and MPE-FEC sections 17 comprised in the bursts 19 into fragments and places them into TS packets $25_A$ (FIG. 25) and multiplexes the TS packets with others, for example carrying MPEG-2 TV service 24, into a multiplex 25 in accordance with ISO/IEC Standard 13818-1 "Information Technology-Generic coding of moving pictures and associated audio information: Systems".

The transmitter 7 also includes a modulating block 26 for generating an r.f. signal 8 in accordance with ETSI EN 300 744 "Digital Video Broadcasting (DVB); Framing structure, channel coding and modulation for digital terrestrial television (DVB-T)" V1.5.1 (2004-06).

Method of Operating the MPE Encapsulator 6

Referring to FIGS. 2, 3A, 3B, and 4-18, a method of operating the MPE encapsulator 6 will now be described.

For a given set of IP streams 9, the MPE encapsulator 6 can transmit data from one MPE-FEC frame 14 in more than one burst 19 and/or transmit data from more than one MPE-FEC frame 14 in one burst 19 in accordance with the present invention.

The MPE encapsulator 6 prepares a plurality of coding tables 27 for holding MPE-FEC frames 14 (step S1). This may simply comprise allocating memory for each coding table 27. As will be explained in more detail later, coding tables 27 and MPE-FEC frames 14 may hold more than 2 Mbits of data.

The MPE encapsulator 6 signals information about time slicing and MPE-FEC for enabling receivers to receive bursts 19 (step S2). This is described in more detail later.

Referring in particular to FIG. 4, the demultiplexer 11 (FIG. 2) receives a plurality of streams 9 including first and second streams $9_1$, $9_2$. The first stream 9 includes a first set of layer 3 datagrams $28_1$ including datagrams $28_{1,1}$, $28_{1,2}$, $28_{1,3}$, $28_{1,4}$. The second stream $9_2$ includes a second set of layer 3 datagrams $28_2$ including datagrams $28_{2,1}$, $28_{2,2}$.

Referring to FIG. 5, each datagram 28 of the first and second sets of datagrams $28_1$, $28_2$ is in the form of Internet Protocol (IP) datagram and comprise a header 29 and a payload 30. However, other types of data frames, such as UDP datagrams, can be used.

Referring now to FIG. 6, the demultiplexer 11 (FIG. 2) filters and outputs the first and second IP streams $9_1$, $9_2$ into first and second filtered streams $12_1$, $12_2$ respectively (step S3). In this example, each filtered stream $12_1$, $12_2$ comprises a single IP stream $9_1$, $9_2$. However, a filtered stream $12_1$, $12_2$ may comprise more than one IP stream.

Figure 7:
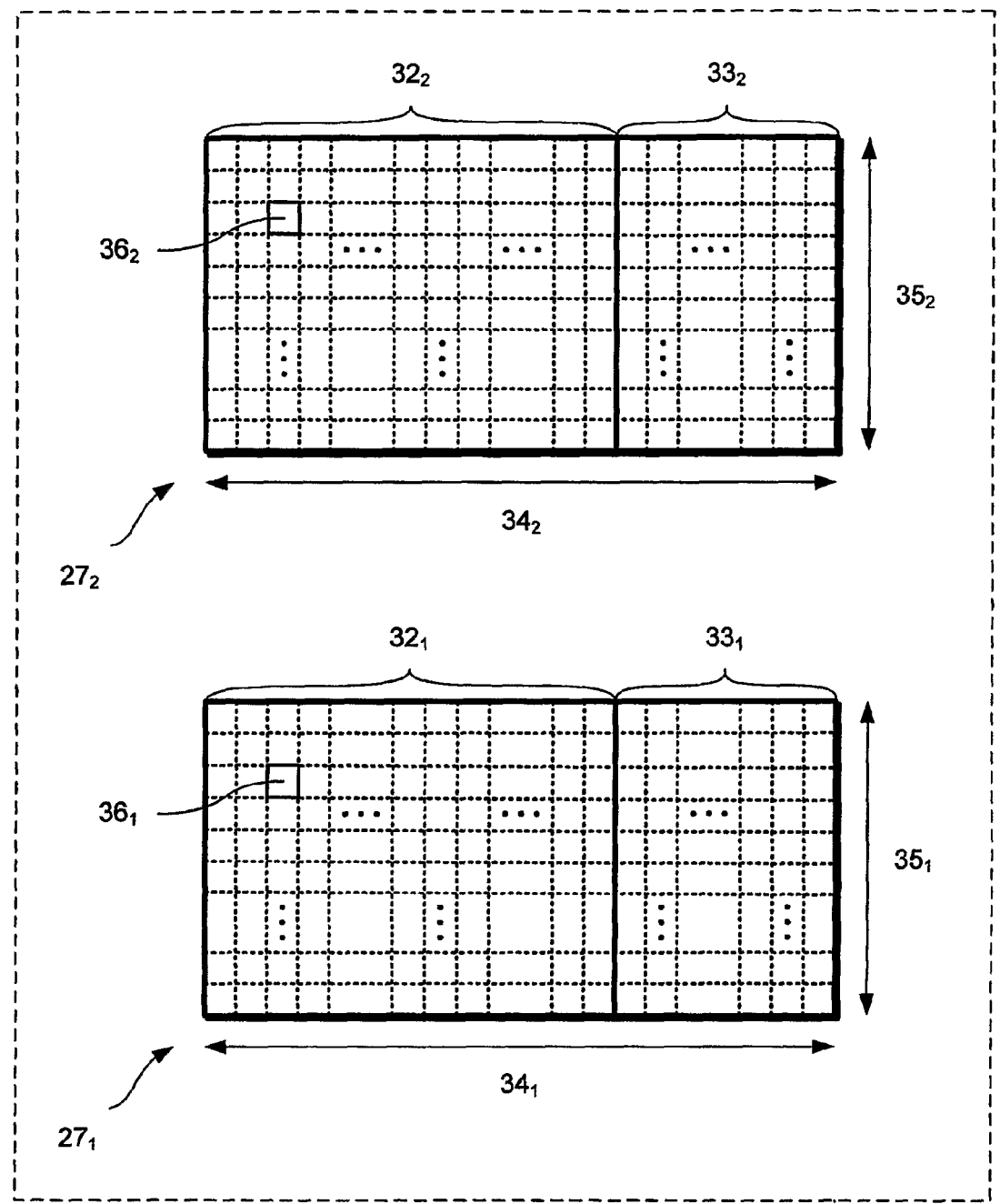
FIG. 7 illustrates first and second coding tables for storing multiprotocol encapsulation-forward error correction (MPE-FEC) frames.

Referring to FIG. 7, the MPE-FEC encoder 13 includes first and second coding tables $27_1$, $27_2$ for the first and second filtered streams $12_1$, $12_2$ (FIG. 6) respectively. Further coding tables (not shown) may be provided, for example, for additional filtered streams. Additionally or alternatively, further coding tables may be provided for the same filtered stream and may be combined to form a single, larger coding table.

The first coding table $27_1$ provides an application data table $32_1$ and a parity data table $33_1$. Likewise, the second coding table $27_2$ provides portions $32_2$, $33_2$ for storing an application data table and a parity data table.

The first coding table $27_1$ may be arranged as a matrix with 255 columns $34_1$ and a flexible number of rows $35_1$. The number of rows $35_1$ is signalled in service information (SI) 10 (FIG. 2). Each position $36_1$ in the coding table $27_1$ holds one byte of data.

The second coding table $27_2$ may also be arranged as a matrix with 255 columns $34_2$ and a flexible number of rows $35_2$. The number of rows $35_2$ can be signaled in service information (SI) 10 (FIG. 2). Each position $36_2$ in the coding table $27_2$ holds one byte of data.

Each position $36_1$, $36_2$ may hold more or less than one byte of data.

For the first coding table $27_1$, the application data table $32_1$ may be provided by the left-most part of the coding table $27_1$ and may comprise 191 columns. The application data table $32_1$ is reserved for datagrams $28_1$ (FIG. 6) from the first filtered stream $12_1$ (FIG. 6) and optional padding data (not shown). The parity data table $33_1$ may be provided by the right-most part of the first coding table $27_1$ and may comprise 64 columns. The parity data table $33_1$ is reserved for parity data. Each position in the application data table $32_1$ has an address ranging from 0 to (191×no_of_rows−1). Similarly, each position in the RS data table $33_1$ has an address ranging from 0 to (64×no_of_rows−1). The first coding table $27_1$ may be differently configured and may comprise a different number of columns. For example, the coding table $27_1$ may be inverted. The application data table $32_1$ may be provided by the right-most part of the coding table $27_1$. The coding table $27_1$ may be divided horizontally with the application data table $32_1$ provided by an upper- or lower-most part of the coding table $27_1$.

For the second coding table $27_2$, the application data table $32_2$ may be provided by the left-most part of the coding table $27_2$ and may comprise 191 columns $32_2$. The application data table $32_2$ is reserved for datagrams $28_2$ (FIG. 6) from the second filtered stream $12_2$ (FIG. 6) and optional padding data (not shown). The parity data table $33_2$ may be provided by the right-most part of the coding table $27_2$ and may comprise 64 columns $33_2$. The parity data table $33_2$ is reserved for parity data. Each position in the application data table $32_2$ has an address ranging from 0 to (191×no_of_rows−1). Similarly, each position in the parity data table $33_2$ has an address ranging from 0 to (64×no_of_rows−1). The second coding table $27_2$ may be differently configured and may comprise a different number of columns.

The coding tables $27_1$, $27_2$ may be differently arranged. For example, the application data tables $32_1$, $32_2$ may comprise the right-most columns of the tables $27_1$, $27_2$. The coding tables $27_1$, $27_2$ may be divided horizontally, rather than vertically, into upper and lower portions.

The first and second coding tables $27_1$, $27_2$ may have different-sized parity data tables $33_1$, $33_2$. In other words, different levels of FEC coding can be used.

The IP streams $9_1$, $9_2$ are directed to the first and second coding tables (step S4).

Figure 8:
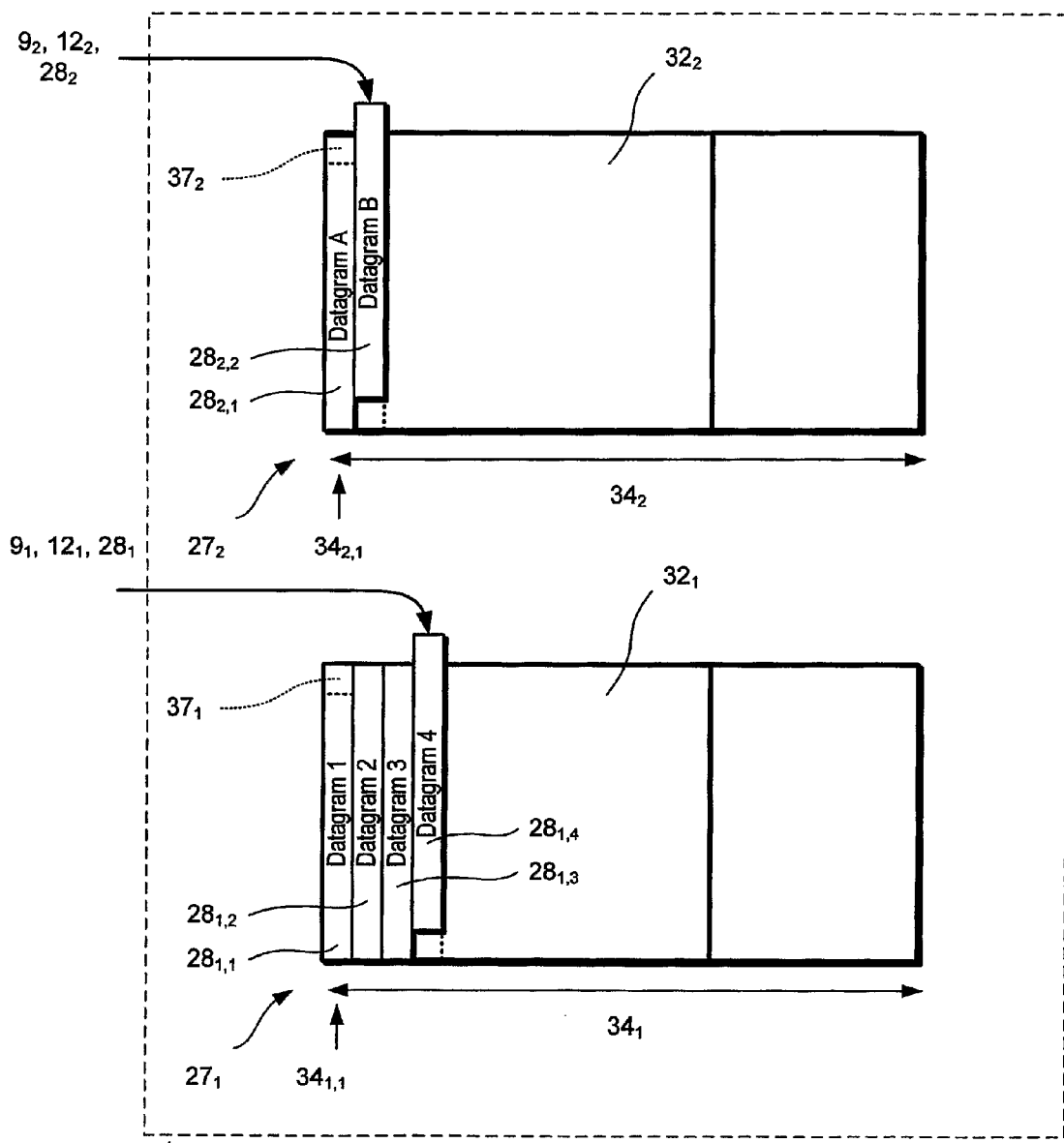
FIG. 8 shows first and second coding tables being filled with IP datagrams.

Referring to FIG. 8, the first set of datagrams $28_1$ are introduced datagram-by-datagram, starting with a first byte $37_1$ of a first datagram $28_{1,1}$ in the upper left corner of the first coding table $27_1$ and going downwards in a first, left-most column $34_{1,1}$. Immediately after the end of the first datagram $28_{1,1}$, a second datagram $28_{1,2}$ starts, followed by a third datagram $28_{1,3}$, a fourth datagram $28_{1,4}$ and so on.

The first and second coding tables $27_1$, $27_2$ may be filled differently. For example, the first byte $37_1$ of the first datagram $28_{1,1}$ may be placed in the upper right corner of the first coding table $27_1$ and going downwards or in the lower left or right corner and going upwards.

Each datagram $28_1$ occupies a respective column $34_1$ in the application data table $32_1$. However, datagrams $28_1$ may each occupy less than one column $34_1$ or more than one column $34_1$. Moreover, the length of each datagram $28_1$ may vary from datagram to datagram. If a datagram $28_1$ does not finish at the end of a column $34_1$, it may continue at the top of the following column $34_1$. When all the datagrams $28_1$ have been entered into the application data table $32_1$, any unfilled byte positions may be padded with zero bytes (not shown), thus completely filling the left-most 191 columns. However, padding need not explicitly added.

Likewise, the second set of datagrams $28_2$ are introduced datagram-by-datagram, starting with a first byte $37_2$ of a first datagram $28_{2,1}$ in the upper left corner of the second coding table $27_2$ and going downwards in a first, left-most column $34_{2,1}$. Immediately after the end of the first datagram $28_{2,1}$, a second datagram $28_{2,2}$ starts and so on.

Each datagram $28_2$ occupies a respective column $34_2$ in the application data table $32_2$. However, datagrams $28_2$ may occupy less than one column $34_2$ or more than a one column $34_2$. Moreover, the length of the datagrams $28_2$ may vary from datagram to datagram. If a datagram $28_2$ does not end at the end of a column $34_2$, it may continue at the top of the following column $34_2$. When all datagrams 28 have entered the application data table $32_2$, any unfilled byte positions may be padded with zero bytes (not shown), thus completely filling the left-most 191 columns. However, padding need not explicitly added.

Figure 9:
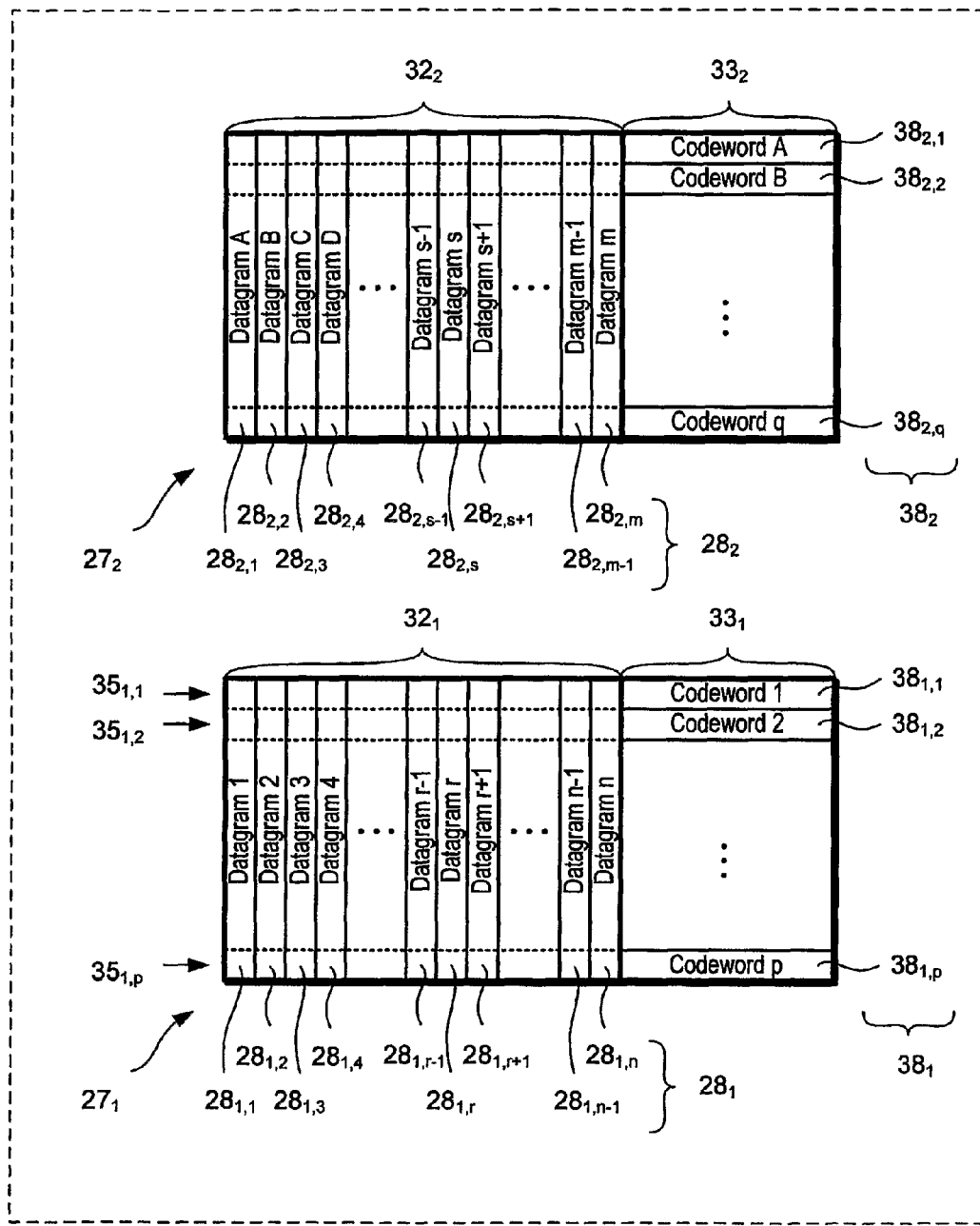
FIG. 9 illustrates first and second coding tables filled with IP datagrams and parity codewords.

Referring now to FIG. 9, the application data table $32_1$ is filled with datagrams $28_1$ including datagrams $28_{1,1}$, $28_{1,2}$, $28_{1,3}$, $28_{1,4}$, $28_{1,r-1}$, $28_{1,r}$, $28_{1,r+1}$, $28_{1,n-1}$, $28_{1,n}$. As mentioned earlier, in some cases, the application data table $32_1$ may only be partially filled with datagrams $28_1$ and padding data may be added to fill it.

Once the application data table $32_1$ is filled, parity data $38_1$ in the form of a set of parity codewords $38_1$ including parity codewords $38_{1,1}$, $38_{1,2}$, $38_{1,p}$ are calculated and placed in the parity data table $33_1$ (step S5). Thus, a first parity codeword $38_{1,1}$ is calculated for a first row $35_{1,1}$, a second parity codeword $38_{1,2}$ is calculated for a second row $35_{1,2}$ and so on until a final parity codeword $38_{1,p}$ is calculated for a final row $35_{1,p}$.

Likewise, the second application data table $32_2$ is filled with datagrams $28_2$ including datagrams $28_{2,1}$, $28_{2,2}$, $28_{2,3}$, $28_{2,4}$, $28_{2,5}$, $28_{2,s-1}$, $28_{2,s}$, $28_{2,s+1}$, $28_{2,m-1}$, $28_{2,m}$.

Once the second application data table $32_2$ is filled, parity data $38_2$ in the form of parity codewords $38_2$ including parity codewords $38_{2,1}$, $38_{2,2}$, ..., $28_{2,q}$ are calculated and placed in the parity data table $33_2$.

A Reed-Solomon (RS) parity code, in this example an RS (255,191,64) code, is used. Thus, the parity data tables $33_1$, $33_2$ are hereinafter referred to as an RS parity data table and the parity codewords $38_1$, $38_2$ are hereinafter referred to as RS codewords. Some of the columns of the RS data table $33_1$, $33_2$ may be discarded and hence not transmitted, to enable puncturing. The exact number of punctured RS columns does not need to be explicitly signaled and may change dynamically between frames. However, other codes may be used.

Figure 10:
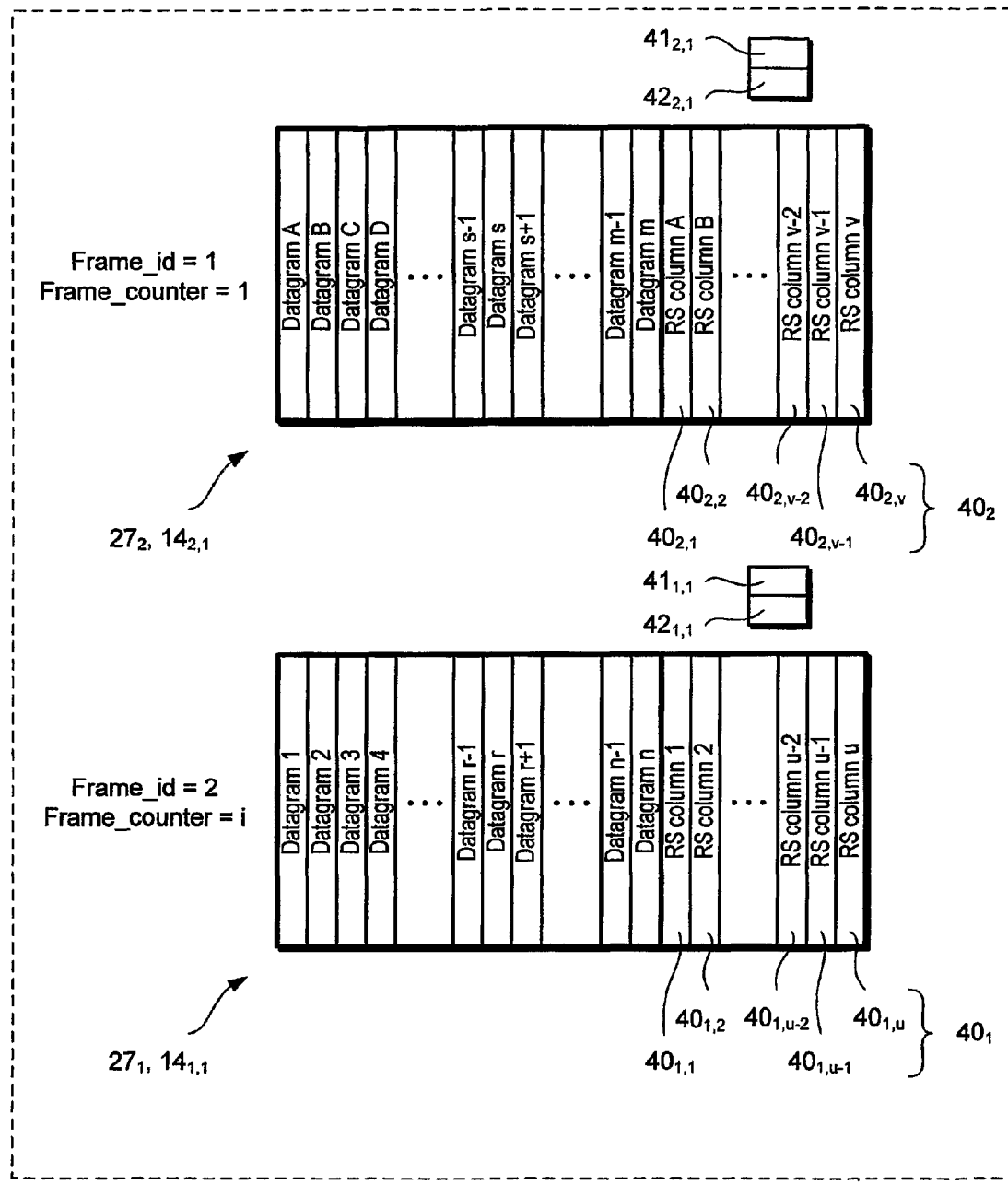
FIG. 10 illustrates a different way of viewing the completed coding tables shown in FIG. 9 together with frame identity and frame counter parameters.

Referring to FIG. 10, completed first and second coding tables $27_1$, $27_2$ holding respective frames of data, herein referred to as MPE-FEC frames $14_{1,1}$, $14_{2,1}$, are shown.

The first RS data table $33_1$ can be divided column-wise to provide RS column data $40_1$ including RS columns $40_{1,1}$, $40_{1,2}$, $40_{1,u-2}$, $40_{1,u-1}$, $40_{1,u}$. Likewise, second RS data table $33_2$ can be divided column-wise to provide RS column data $40_2$ including RS columns $40_{2,1}$, $40_{2,2}$, $40_{2,v-2}$, $40_{2,v-1}$, $40_{2,v}$.

A series of MPE-FEC frames $14_{1,1}$, $14_{1,2}$, $14_{2,1}$, $14_{2,1}$ (FIG. 19) is generated for each filtered stream $12_1$, $12_2$. To identify each frame $14_{1,1}$, $14_{1,2}$, $14_{2,1}$, $14_{2,1}$, the frames $14_{1,1}$, $14_{1,2}$, $14_{2,1}$, $14_{2,1}$ (FIG. 19) are labeled according to their filtered stream $12_1$, $12_2$, which is indicated using a frame identity parameter, Frame_id, and according to their position within the series of frames, which is indicated using a frame counter parameter, Frame_counter.

Thus, frame identity and frame counter parameters $41_{1,1}$, $42_{1,1}$, $41_{2,1}$, $42_{2,1}$ are generated for each frame $14_{1,1}$, $14_{2,1}$. In this example, Frame_id=1 and Frame_counter=1 for the first MPE-FEC frames $14_{1,1}$ and Frame_id=2 and Frame_counter=1 for the second MPE-FEC frames $14_{2,1}$.

As mentioned earlier, the MPE encapsulator 6 can transmit data from one MPE-FEC frame 14 in more than one burst 19 and/or transmit data from more than one MPE-FEC frame 14 in one burst 19 in accordance with the present invention. The MPE encapsulator 6 can also transmit one MPE-FEC frame 14 in one burst 19 in a conventional way, but this will not be described.

Figure 19:
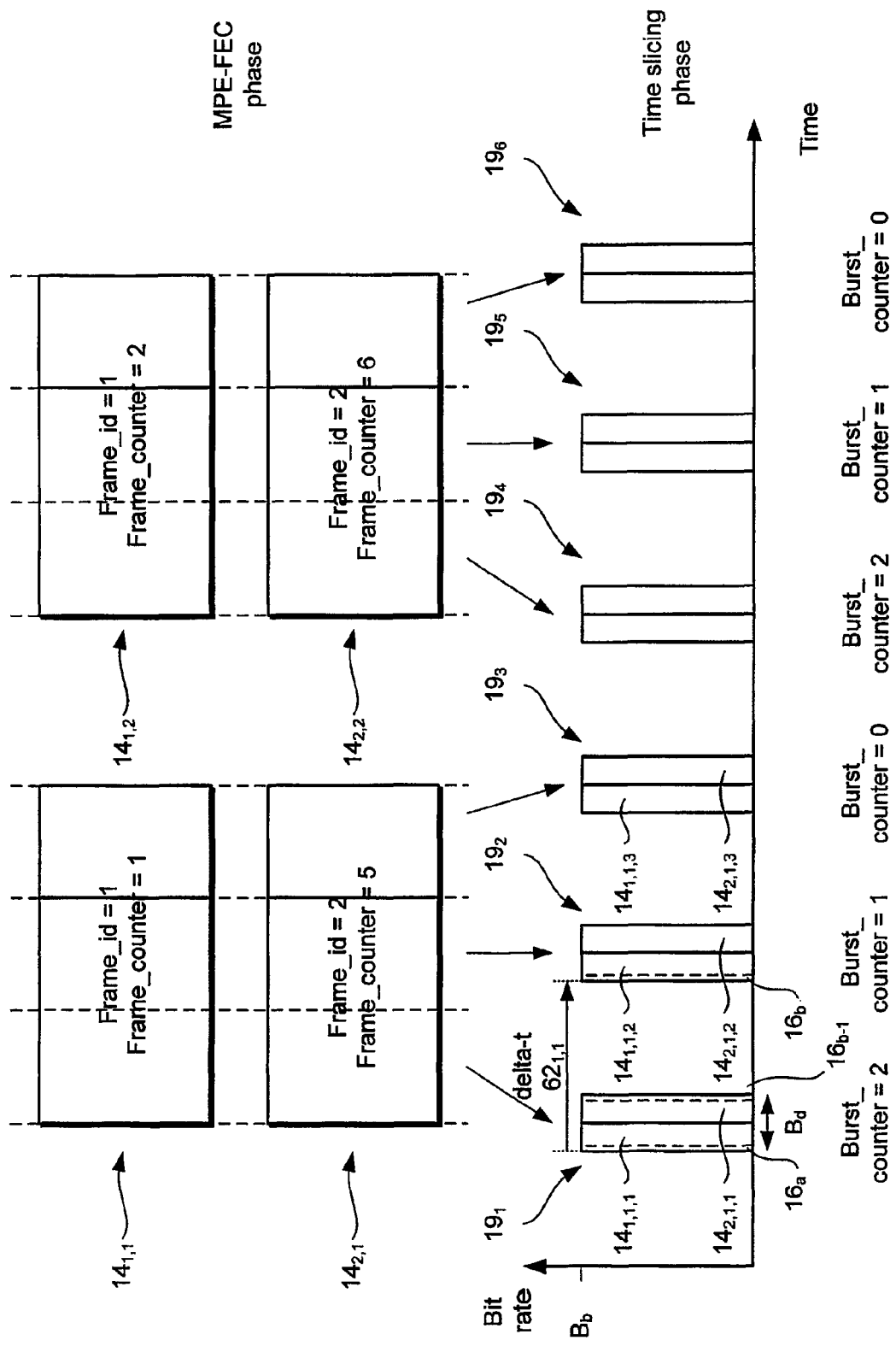
FIG. 19 shows division of an MPE-FEC frame between a plurality of bursts in accordance with the present invention.

In this case, each MPE-FEC frame $14_{1,1}$, $14_{2,1}$ will be transmitted in more than one burst $19_1$, $19_2$, $19_3$ (FIG. 19).

Figure 11:
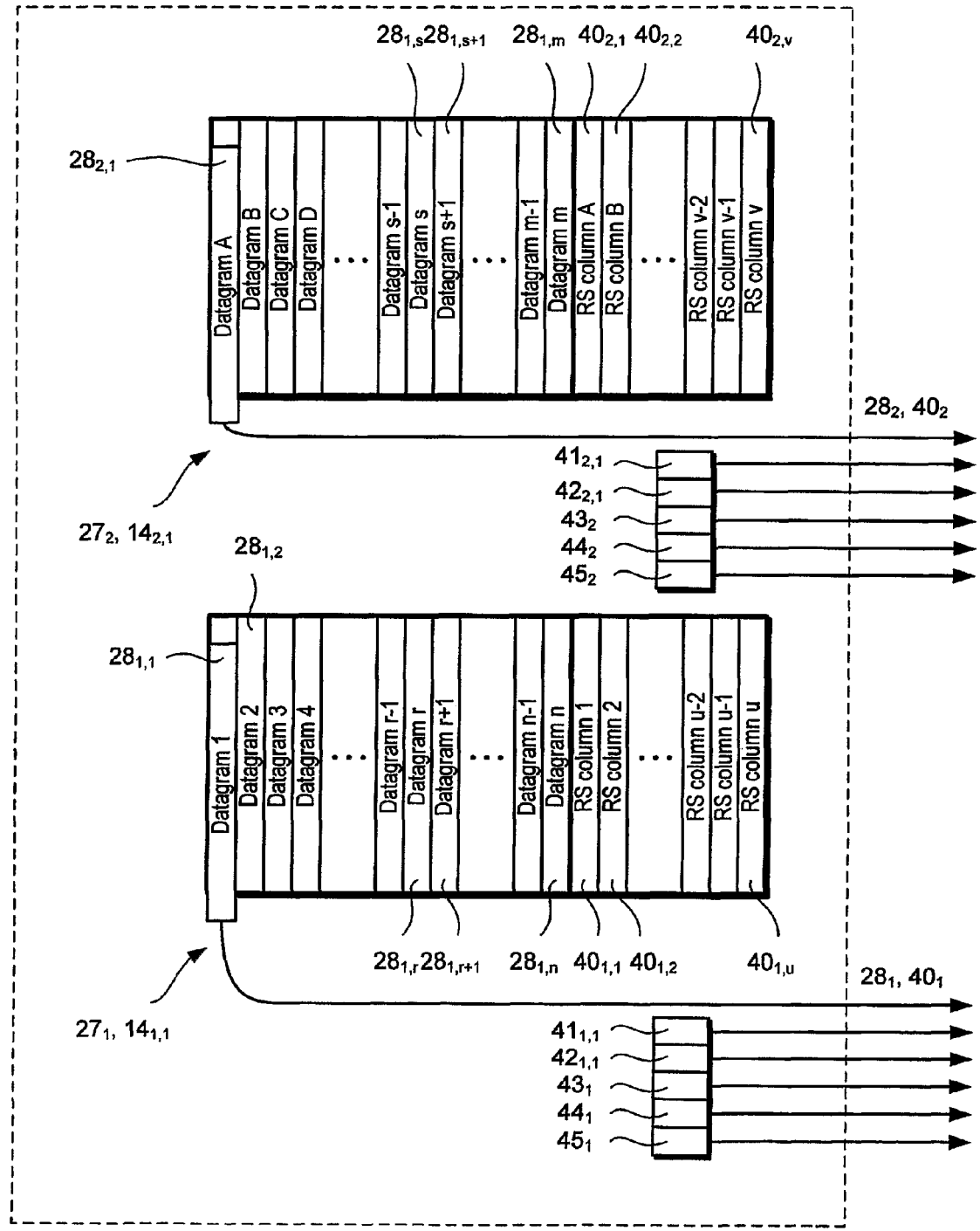
FIG. 11 shows datagrams being read out from the first and second coding tables.

Referring to FIG. 11, the datagrams $28_1$, $28_2$ are read out from the coding tables $27_1$, $27_2$.

As each datagram $28_1$ or RS column $40_1$ is read out from the first coding table $27_1$, the encoder 13 may also output an address $43_1$ of the first byte of the datagram $28_1$, a table boundary flag $44_1$ for indicating whether the datagram $28_1$ or RS column $40_1$ is the last in the frame $14_{1,1}$ and a frame boundary flag $45_1$.

Likewise, as each datagram $28_2$ or RS column $40_2$ is read out from the second coding table $27_2$, the encoder 13 may also output an address $43_2$ of the first byte of the datagram $28_2$ or RS column $40_2$, a table boundary flag $44_2$ for indicating whether the datagram $28_2$ or RS column $40_2$ is the last in the frame $14_{2,1}$ and a frame boundary flag $45_2$.

The datagrams $28_1$, $28_2$ and RS columns $40_1$, $40_2$ are interleaved (steps S6 & S7).

A first datagram $28_{1,1}$ is read out from the first coding table $27_1$ and datagrams are read out sequentially from the first coding table $27_1$ until an r–$1^{th}$ datagram $28_{1,r-1}$ is read out. Then, a first datagram $28_{2,1}$ is read out from the second coding table $27_2$ and datagrams are read out sequentially from the second coding table $27_2$ until an s–$1^{th}$ datagram $28_{2,s-1}$ is read out.

An $r^{th}$ datagram $28_{1,r}$ is read out from the first coding table $27_1$ and datagrams are read out sequentially from the first coding table $27_1$ until an $n^{th}$ datagram $28_{1,n}$ is read out. Then, an $s^{th}$ datagram $28_{2,s}$ is read out from the second coding table $27_2$ and datagrams are read out sequentially from the second coding table $27_2$ until an $m^{th}$ datagram $28_{2,m}$ is read out.

A first RS column $40_{1,1}$ is read out from the first coding table $27_1$ and RS columns are read out sequentially from the first coding table $27_1$ until a $u^{th}$ RS column $40_{1,u}$ is read out. Then, an first RS column $40_{2,1}$ is read out from the second coding table $27_2$ and RS columns are read out sequentially from the second coding table $27_2$ until a $v^{th}$ RS column $40_{2,v}$ is read out.

Figure 12:
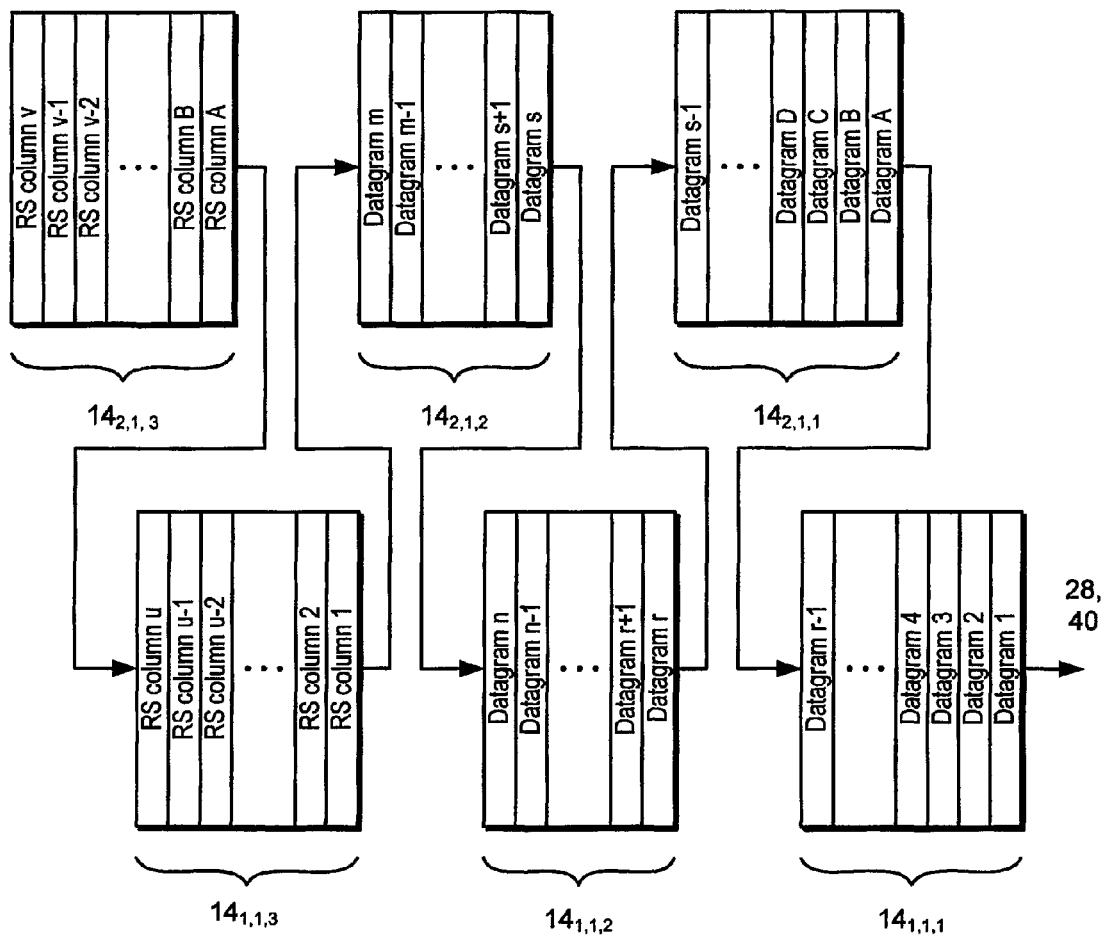
FIG. 12 illustrates interleaving of MPE-FEC frame blocks.

Referring to FIG. 12, the effect of selectively reading out datagrams $28_1$, $28_2$ and RS columns $40_1$, $40_2$ from the coding tables $27_1$, $27_2$ in the order described earlier is to divide each MPE-FEC frames $14_{1,1}$, $14_{2,1}$ into three frame blocks $14_{1,1,1}$, $14_{1,1,2}$, $14_{1,1,3}$, $14_{2,1,1}$, $14_{2,1,2}$, $14_{2,1,3}$ and interleave the frame blocks $14_{1,1,1}$, $14_{1,1,2}$, $14_{1,1,3}$, $14_{2,1,1}$, $14_{2,1,2}$, $14_{2,1,3}$. The frame blocks $14_{1,1,1}$, $14_{1,1,2}$, $14_{1,1,3}$, $14_{2,1,1}$, $14_{2,1,2}$, $14_{2,1,3}$ are unequal in size. However, MPE-FEC frames $14_{1,1}$, $14_{2,1}$ may each be divided into frame blocks which are equal in size or as close to equal in size as is practicable. The MPE-FEC frames $14_{1,1}$, $14_{2,1}$ may be divided into fewer or more blocks $14_{1,1,1}$, $14_{1,1,2}$, $14_{1,1,3}$, $14_{2,1,1}$, $14_{2,1,2}$, $14_{2,1,3}$ or not divided at all. Furthermore, the frame blocks $14_{1,1,1}$, $14_{1,1,2}$, $14_{1,1,3}$, $14_{2,1,1}$, $14_{2,1,2}$, $14_{2,1,3}$ may be interleaved in a different order. Moreover, the frame blocks $14_{1,1,1}$, $14_{1,1,2}$, $14_{1,1,3}$, $14_{2,1,1}$, $14_{2,1,2}$, $14_{2,1,3}$ may be interleaved with other frame blocks from other frames (not shown) at least some of which may originate from the same filtered stream $12_1$, $12_2$.

Figure 13:
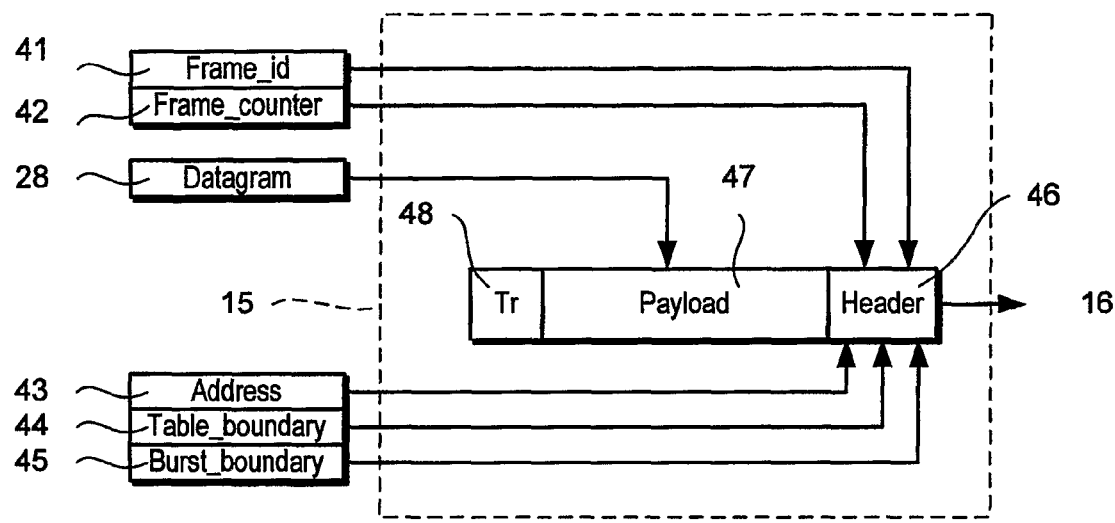
FIG. 13 illustrates preparation of an MPE section.
Figure 14:
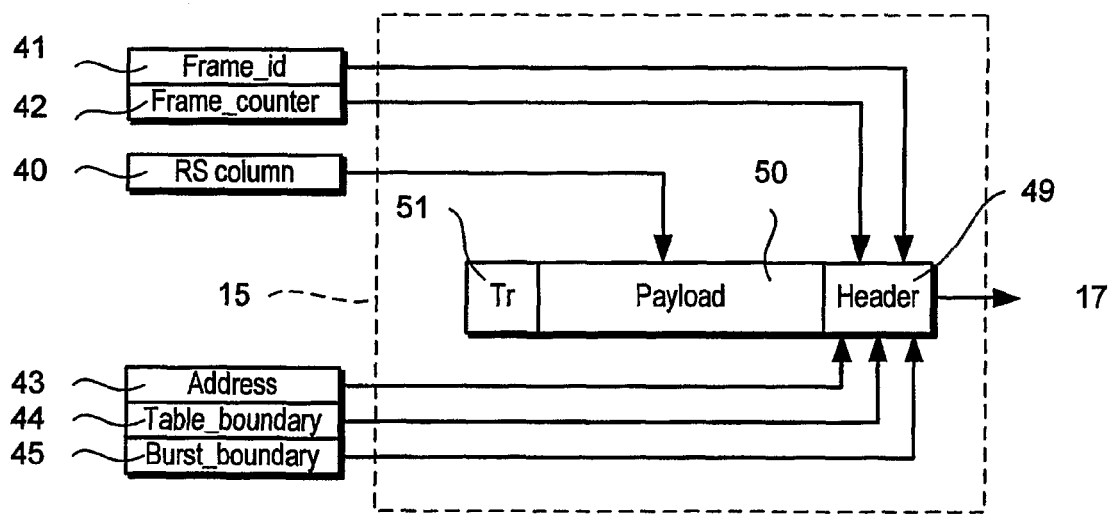
FIG. 14 illustrates preparation of an MPE-FEC section.

Referring to FIGS. 13 and 14, datagrams 28 and RS columns 40 comprised in the frame blocks $14_{1,1,1}$, $14_{1,1,2}$, $14_{1,1,3}$, $14_{2,1,1}$, $14_{2,1,2}$, $14_{2,1}$ (FIG. 12) are supplied to the MPE/MPE-FEC section encapsulating block 15, together with respective frame identity and frame counter parameters 41, 42 for the frame $14_{1,1}$, $14_{2,1}$ (FIG. 11) to which they belong and respective address data 43, table boundary flag 44 and burst boundary flag 45.

Referring in particular to FIG. 13, the MPE/MPE-FEC section encapsulating block 15 generates and outputs MPE sections 16, each MPE section 16 comprising a header 46, a payload 47 and a trailer 48 (step S8).

When MPE/MPE-FEC section encapsulating block 15 receives a datagram 28, it maps the datagram 28 into the payload 47 and places corresponding frame identity and frame counter parameters 41, 42 into the header 46 (step S9). The MPE/MPE-FEC section encapsulating block 15 can also place address data 43, table boundary flag 44 and frame boundary flag 45 in the header 46 (step S10). The MPE/MPE-FEC section encapsulating block 15 may map more than one datagram 28 into the payload 47.

Referring to FIG. 14, the MPE/MPE-FEC section encapsulating block 15 also generates and outputs MPE-FEC sections 17, each MPE-FEC section 17 comprising a header 49, a payload 50 and a trailer 51.

When the MPE/MPE-FEC section encapsulating block 15 receives an RS column 40, it maps the RS column 40 into a payload 50 of an MPE-FEC section 17 and places corresponding frame identity and frame counter parameters 41, 42 into the header 49. The MPE/MPE-FEC section encapsulating block 15 can also places address data 43, table boundary flag 44 and frame boundary flag 45 into the header 49.

MPE and MPE-FEC sections 16, 17 are compliant with Digital Storage Medium Command and Control (DSM-CC) section format, shown in Table 1 below:

TABLE 1

| Syntax | No. of bits | Identifier |
| --- | --- | --- |
| datagram_section() { | | |
| table_id | 8 | uimsbf |
| section_syntax_indicator | 1 | bslbf |
| private_indicator | 1 | bslbf |
| Reserved | 2 | bslbf |
| section_length | 12 | uimsbf |
| MAC_address_6 | 8 | uimsbf |
| MAC_address_5 | 8 | uimsbf |
| Reserved | 2 | bslbf |
| payload_scrambling_control | 2 | bslbf |
| address_scrambling_control | 2 | bslbf |
| LLC_SNAP_flag | 1 | bslbf |
| current_next_indicator | 1 | bslbf |
| section_number | 8 | uimsbf |
| last_section_number | 8 | uimsbf |
| MAC_address_4 | 8 | uimsbf |
| MAC_address_3 | 8 | uimsbf |
| MAC_address_2 | 8 | uimsbf |
| MAC_address_1 | 8 | uimsbf |
| if (LLC_SNAP_flag == "1") { | | |
| LLC_SNAP() | | |

TABLE 1-continued

| Syntax | No. of bits | Identifier |
|---|---|---|
| } else { | | |
|     for (j=0;j<N1;j++) { | | |
|         IP_datagram_data_byte | 8 | bslbf |
|     } | | |
| } | | |
| if (section_number == last_section_number) { | | |
|     for (j=0;j<N2;j++) { | | |
|         stuffing_byte | 8 | bslbf |
|     } | | |
| } | | |
| if (section_syntax_indicator =="0") { | | |
|     Checksum | 32 | uimsbf |
| } else { | | |
|     CRC_32 | 32 | rpchof |
| } | | |
| } | | |

Figure 15:
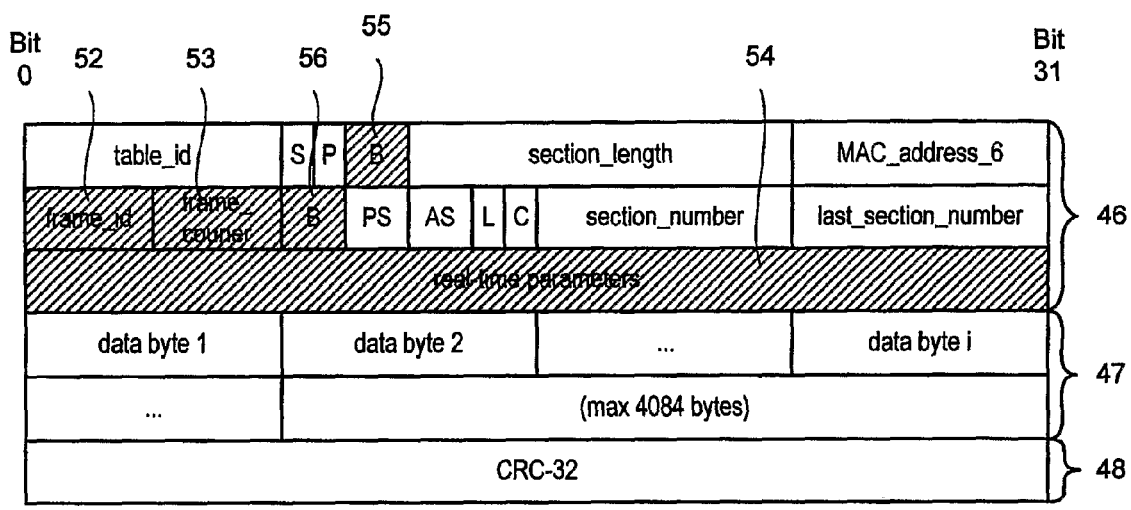
FIG. 15 is a schematic diagram of an MPE section.

Referring to FIG. 15, in an MPE section 16, a fifth MAC address field can be divided to provide first and second fields 52, 53 for storing frame identity and frame counter parameters 41, 42 respectively. The first and second fields 52, 53 may each comprise four bits. First, second, third and fourth MAC address fields are used to provide a real time parameter field 54. Reserved fields are used to provide third and fourth fields 55, 56 for storing a burst number 63 (FIG. 18), which may comprise three or four bits. The burst number will be explained in more detail later. The first, second, third and fourth fields 52, 53, 55, 56 may be apportioned differently to permit use of smaller or larger values. If a different header structure is used or if further bits become available, then larger values of frame identity, frame counter and burst number 41, 42, 63 can be used.

Figure 16:
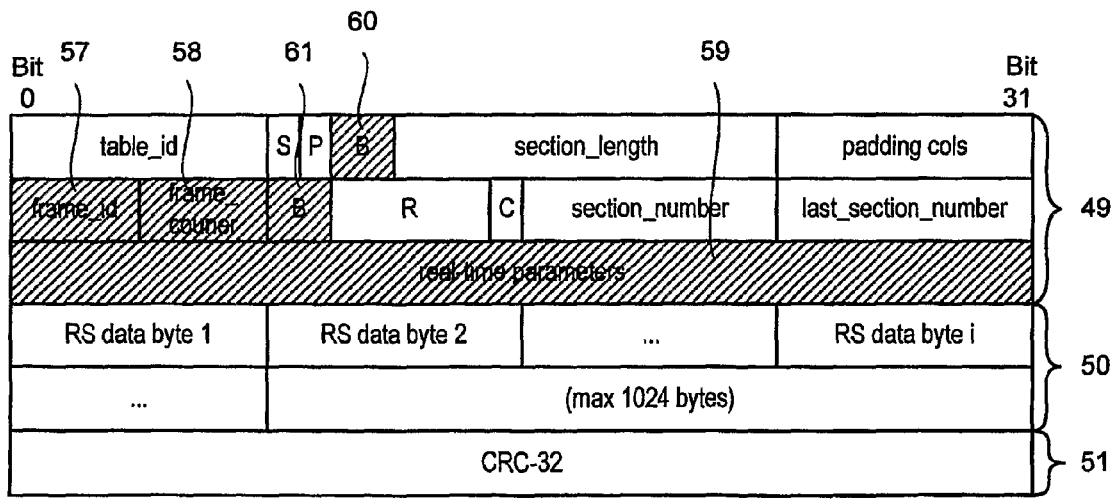
FIG. 16 is a schematic diagram of an MPE-FEC section.

Referring to FIG. 16, in an MPE-FEC section 17, a fifth MAC address field can be divided to provide first and second fields 57, 58 for storing frame identity and frame counter parameters 41, 42 respectively. The first and second fields 57, 58 may each comprise four bits. First, second, third and fourth MAC address fields are used to provide a real time parameter field 59. Reserved fields are used to provide third and fourth fields 60, 61 for storing a burst number 63, (FIG. 18) which may comprise three or four bits. The first, second, third and fourth fields 57, 58, 60, 61 may be apportioned differently to permit use of smaller or larger values. If a different header structure is used or if further bits become available, then larger values of frame identity, frame counter and burst number 41, 42, 63 can be used.

The real time parameter fields 54, 59 are compliant with the syntax as shown in Table 2 below:

TABLE 2

| Syntax | No. of bits | Identifier |
|---|---|---|
| realtime paramters( ) { | | |
|     delta_t | 12 | uimsbf |
|     table_boundary | 1 | bslbf |
|     burst_boundary | 1 | bslbf |
|     Address | 18 | uimsbf |
| } | | |

The burst boundary field, burst_boundary, is used to indicate the end of a burst and receives the burst boundary flag 45 (FIG. 13). The frame boundary flag 45 can be used to indicate different frames in the same burst.

Figure 17:
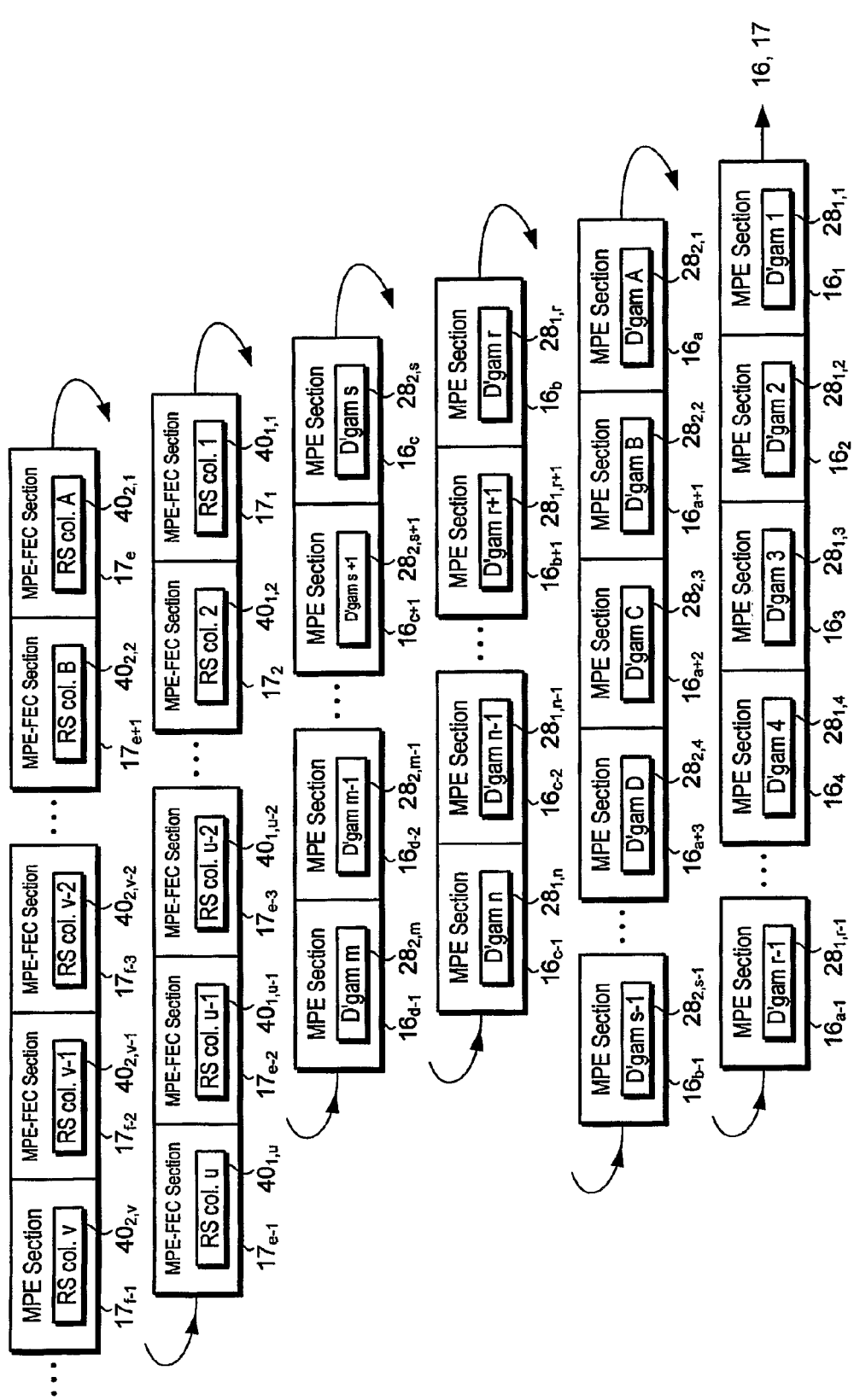
FIG. 17 illustrates a stream of MPE and MPE-FEC sections.

Referring to FIG. 17, the MPE/MPE-FEC section encapsulating block 15 outputs MPE sections 16 including $16_1$, $16_2$, $16_3$, $16_4$, $16_{a-1}$, $16_a$, $16_{a+1}$, $16_{a+2}$, $16_{a+3}$, $16_{b-1}$, $16_b$, $16_{b+1}$, $16_{c-2}$, $16_{c-1}$, $16_c$, $16_{c+1}$, $16_{d-2}$, $16_{d-1}$ and MPE-FEC sections 17 including $17_1$, $17_2$, $17_{e-3}$, $17_{e-2}$, $17_{e-1}$, $17_e$, $17_{e+1}$, $17_{f-3}$, $17_{f-2}$, $17_{f-1}$.

The MPE sections 16 and MPE-FEC sections 17 comprise datagrams $28_{1,1}$, $28_{1,2}$, $28_{1,3}$, $28_{1,4}$, $28_{1,r-1}$, $28_{1,r}$, $28_{1,r+1}$, $28_{1,n-1}$, $28_{1,n}$, datagrams $28_{2,1}$, $28_{2,2}$, $28_{2,3}$, $28_{2,4}$, $28_{2,s-1}$, $28_{2,s}$, $28_{2,s+1}$, $28_{2,m-1}$, $28_{2,m}$, RS columns $40_{1,1}$, $40_{1,2}$, $40_{1,u-2}$, $40_{1,u-1}$, $40_{1,u}$ and RS columns $40_{2,1}$, $40_{2,2}$, $40_{2,v-2}$, $40_{2,v-1}$, $40_{2,v}$, interleaved in the order described earlier. However, the MPE sections 16 and MPE-FEC sections 17 can be interleaved in other, different orders.

Datagrams 28 are carried in MPE sections 16 irrespective of whether MPE-FEC is used. This makes reception fully backwards compatible with receivers (not shown) which are not enabled for MPE-FEC. As mentioned earlier, each MPE section 16 carries a start address 43 (FIG. 13) for the payload 47 (FIG. 13) in the section header 46 (FIG. 13). This address 43 (FIG. 13) indicates the byte position in the application data table of the first byte of the section payload 47 (FIG. 13). If the datagram 28 is divided over multiple MPE sections 16, each MPE section 16 indicates the byte position in the application data table of the first byte of the datagram fragment carried within the section. A receiver (not shown) puts the received datagram 28 in the right byte positions in the application data table and marks these positions as "reliable" for the RS decoder, provided the section CRC-32 check shows that the section is correct.

The last section of the application data table contains a table boundary flag, which indicates the end of the datagrams within the application data table. If all previous sections within the application data table have been received correctly the receiver does not need to receive any MPE-FEC sections and, if time slicing is used, the receiver can be switched off without receiving and decoding RS data. If MPE-FEC sections 17 are also received, the number of padding columns, i.e. columns filled with padding bytes only, in the application data table is indicated with eight bits in the section header of the MPE-FEC sections. This value is only needed if RS decoding is performed. If the section carrying the table_boundary is lost, the receiver (not shown) may not know the exact position of where application data ends and padding starts. However, from the padding columns, it knows how many full columns were padding and so these can be marked as being reliable.

RS columns are carried in MPE-FEC sections 17. Each MPE-FEC section 17 carries exactly one column of the RS data table, although they can carry less than one column or more than one column. Punctured columns are not transmitted and the number of punctured columns is not signaled explicitly, but signaled with the last section number in MPE-FEC section header.

Figure 18:
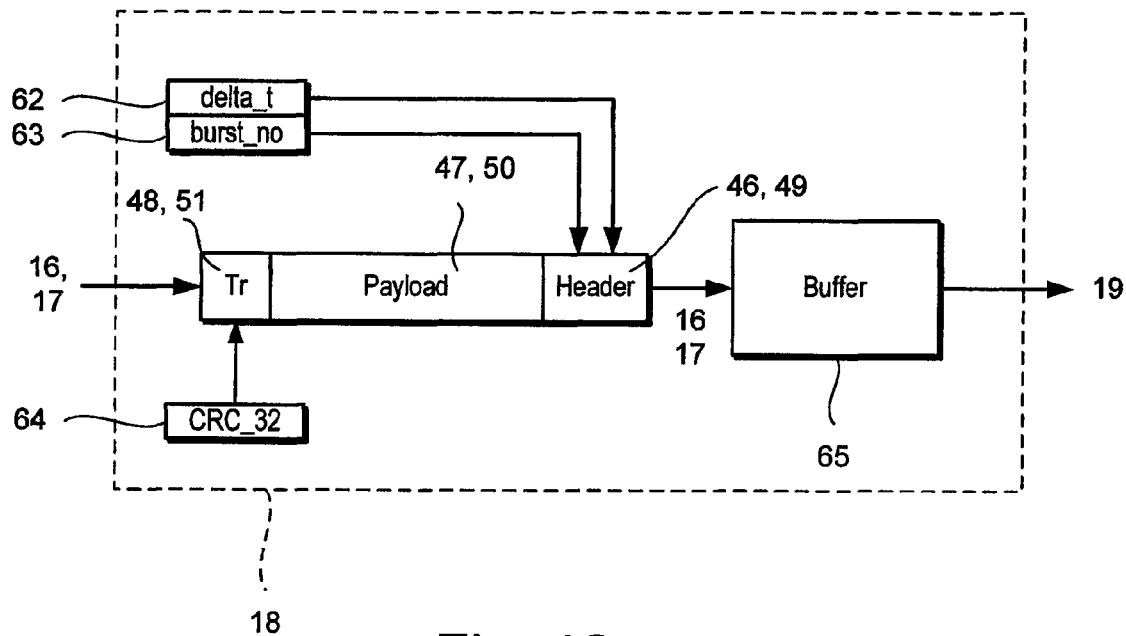
FIG. 18 illustrates addition of delta-t and burst number parameters to an MPE or MPE-FEC section.
Figure 24:
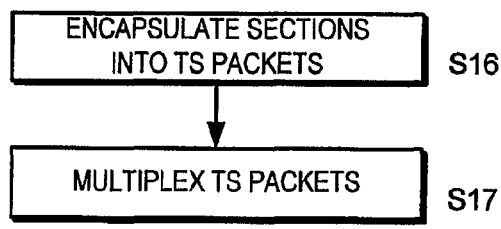
FIG. 24 is a simplified process flow diagram of a method of operating a transmitter.

Referring to FIG. 18, the time slicing module 18 receives the MPE sections 16 and MPE-FEC sections 17 and places corresponding values of delta t 62 and burst number 63 for each section 16, 17 into the header 46, 49 of the section 16, 17 (steps S11 & S12). The time slicing module 18 also calculates cyclical redundancy code (CRC-32) data 64 for each section 16, 17 and places the CRC-32 data 64 into the trailer 48, 51 of the section 16, 17.

MPE sections 16 and MPE-FEC sections 17 are forwarded to buffer 65. Sections 16, 17 having the same burst number 63 are collected and forwarded to the transmitter 7 (FIG. 2) as in bursts 19 (step S13).

Referring to FIG. 19, the MPE sections 16 carried in first and fourth frame blocks $14_{1,1,1}$, $14_{2,1,1}$ and which include MPE sections $16_1$, $16_2$, $16_3$, $16_4$, $16_{a-1}$, $16_a$, $16_{a+1}$, $16_{a+2}$, $16_{a+3}$, $16_{b-1}$ (FIG. 17) are arranged into a first burst $19_1$. The MPE sections 16 carried in second and fifth frame blocks $14_{1,1,2}$, $14_{2,1,2}$ and which include MPE sections $16_b$, $16_{b+1}$, $16_{c-2}$, $16_{c-1}$, $16_c$, $16_{c+1}$, $16_{d-2}$, $16_{d-1}$ (FIG. 17) are arranged into a second burst $19_2$. The MPE-FEC sections 17 carried in third and sixth frame blocks $14_{1,1,3}$, $14_{2,1,3}$ and which include MPE-FEC sections $17_1$, $17_2$, $17_{e-3}$, $17_{e-2}$, $17_{e-1}$, $17_e$, $17_{e+1}$, $17_{f-3}$, $17_{f-2}$, $17_{f-1}$ (FIG. 17) are arranged into a third burst $19_3$. The bursts $19_1$, $19_2$, $19_3$ are each transmitted at a bitrate $B_b$ and have a burst duration $B_d$.

The last section in each burst 19 is identified as such using burst boundary flag 45 (FIG. 13). For example, the burst boundary flag 45 (FIG. 13) in section $16_{b-1}$ is set to '1'. A receiver (not shown) can use the burst boundary flag 45 (FIG. 13) to determine when it has received a burst and, thus, when it should 'go to sleep'.

Each section 16, 17 carries a value of a duration of time from time of transmission of the section 16, 17, until time of transmission of the first section 16, 17 in the next burst 19. For example, delta-t $62_{1,1}$ for the first MPE section $16_a$ indicating the duration of time until MPE section $16_b$ is transmitted is illustrated. A receiver (not shown) can use the delta-t parameter 62 (FIG. 18) to determine when it should 'wake-up' and receive the next burst 19.

The same value of the burst number parameter 63 (FIG. 18) is used in sections 16, 17 within the same burst 19. In this example, the bursts are numbered counting down, beginning with a value two and ending at zero. A receiver (not shown) can use the burst number parameter 63 (FIG. 18) to determine whether a burst 19 has been lost or whether it has received all the bursts for a given MPE-FEC frame 14.

If three bits are used for the burst number parameter 63, then a burst can start with a burst number up to fifteen. If four bits are units, for example as provided by reserved field 55, 56 (FIG. 15) in an MPE section 16 or reserved fields 60, 61 (FIG. 16) in an MPE-FEC section 17, a burst can start with a burst number up to thirty-one. The burst number can be cyclical, beginning again at fifteen (or thirty-one) after it has reached zero.

The process of preparing and transmitting MPE-FEC frames continues with the preparation and transmission of third and fourth MPE-FEC frames $14_{1,2}$, $14_{2,2}$, prepared using the first and second coding tables $27_1$, $27_2$, which are transmitted in fourth, fifth and sixth bursts $19_4$, $19_5$, $19_6$ (step S14) until the datagrams $28_1$, $28_2$ in the filtered stream $12_1$, $12_2$ have been transmitted (step S15).

In the example just described, the first and second MPE-FEC frames $14_{1,1}$, $14_{2,1}$ were each divided into three blocks $14_{1,1,1}$, $14_{1,1,2}$, $14_{1,1,3}$, $14_{2,1,1}$, $14_{2,1,2}$, $14_{2,1,3}$. However, the MPE-FEC frames $14_{1,1}$, $14_{2,1}$ can be divided into fewer or more blocks. The blocks may be of equal or unequal sizes.

Figure 20:
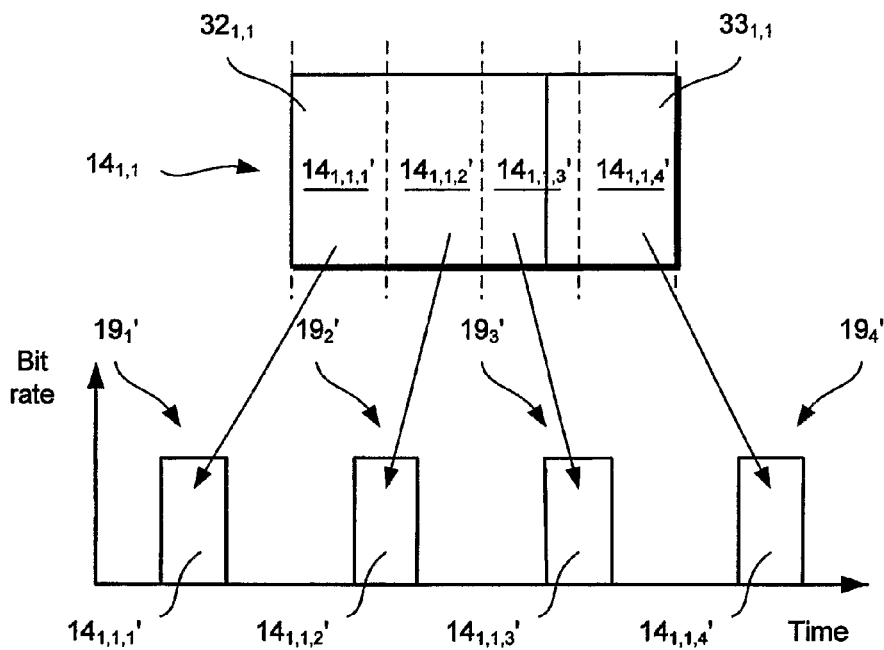
FIG. 20 illustrates another way of dividing an MPE-FEC frame.

Referring to FIG. 20, the first MPE-FEC frame $14_1$ may be divided into four blocks $14_{1,1,1}'$, $14_{1,1,2}'$, $14_{1,1,3}'$, $14_{1,1,4}'$ and transmitted in four bursts $19_1'$, $19_2'$, $19_3'$, $19_4'$. Similarly, the second MPE-FEC frame $14_1$ (FIG. 19) may be divided into four blocks (not shown). Furthermore, a block $14_{1,1,3}'$ may carry data from both the application data table $32_{1,1}$ and the RS data table $33_{1,1}$, in other words carry MPE sections 16 and MPE-FEC sections 17.

An advantage of distributing data from one MPE-FEC frame between more than one burst is that interleaving length for the frame is increased. If there is 'shot' of noise which affects a burst, the chances of losing all the data from one MPE-FEC frame are decreased. Any errors in the data arising from the shot of noise can be corrected using the FEC parity data.

Additionally or alternatively, larger MPE-FEC frames 14 may be used to help distribute data from one MPE-FEC frame 14 between plural bursts 19, as will now be described in more detail.

Figure 21:
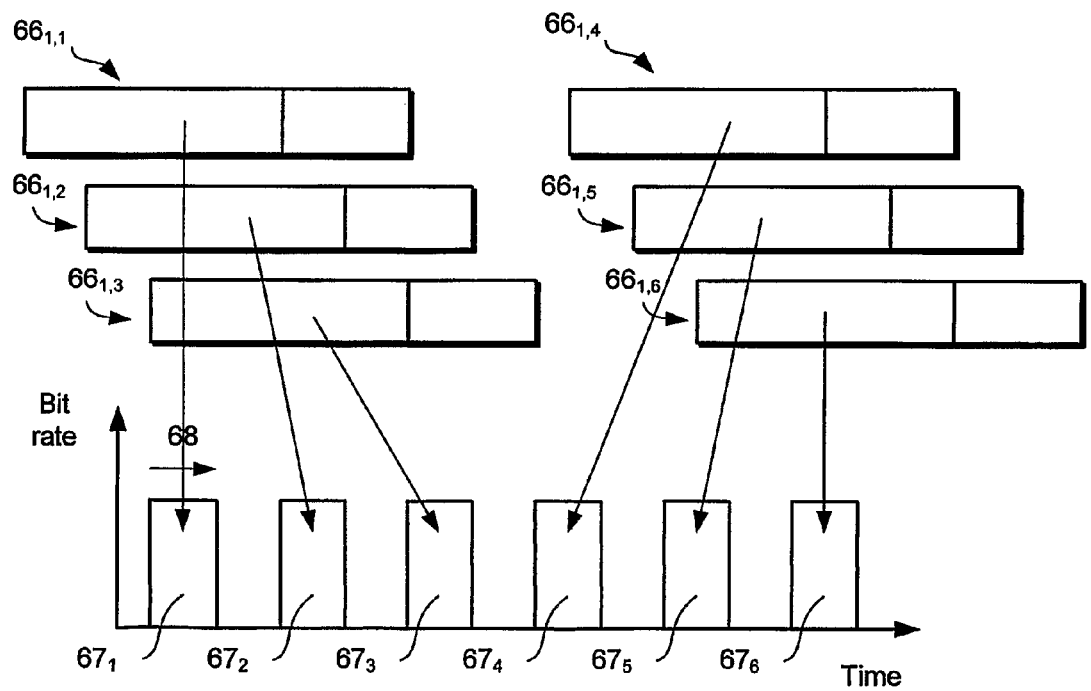
FIG. 21 illustrates a prior art way of transmitting an MPE-FEC frame in one burst.

Referring to FIG. 21, a conventional arrangement for transmitting MPE-FEC frames is shown. In the conventional arrangement, six MPE-FEC frames $66_{1,1}$, $66_{1,2}$, $66_{1,3}$, $66_{1,4}$, $66_{1,5}$, $66_{1,6}$, each having 1024 rows, are transmitted in a respective bursts $67_1$, $67_2$, $67_3$, $67_4$, $67_5$, $67_6$. A drawback of this arrangement is that it has a short interleaving depth 68. As mentioned earlier, if a shot of noise affects one of the bursts, for example the second burst $67_2$, then all of the data comprised in the MPE-FEC frame, in this example the second MPE-FEC frame $66_{1,2}$, may be lost.

Figure 22:
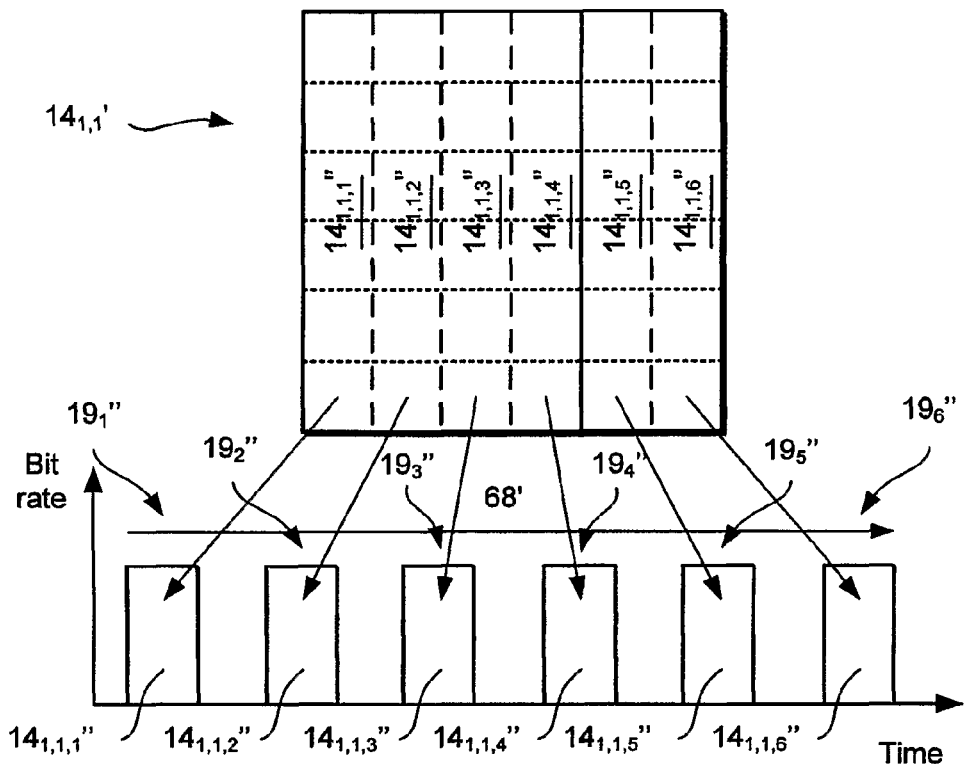
FIG. 22 illustrates division of a large MPE-FEC frame between a plurality of bursts in accordance with the present invention.
Figure 31:
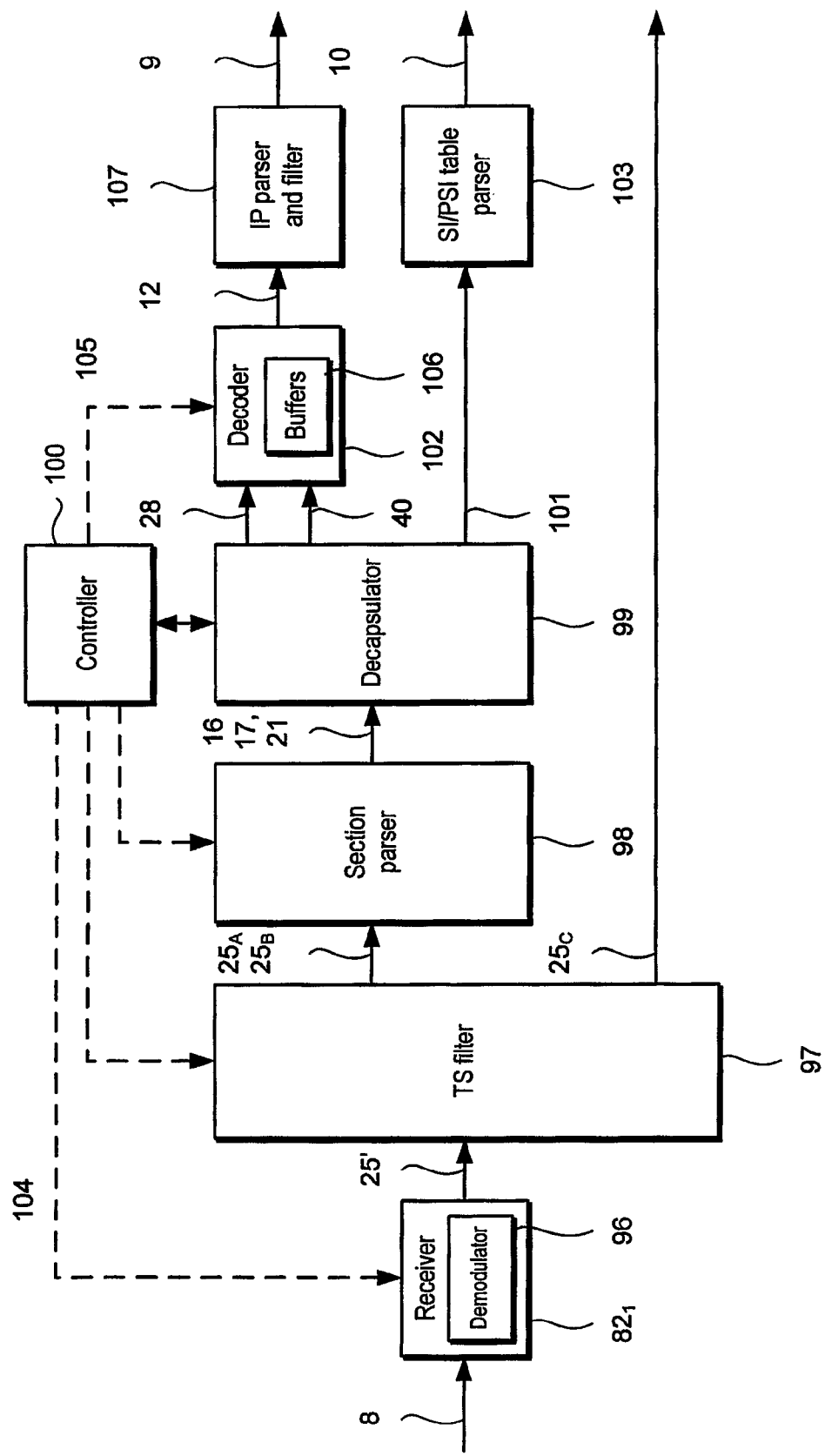
FIG. 31 is a functional block diagram of part of the a mobile terminal.

Referring to FIG. 22, an exemplary arrangement for transmitting MPE-FEC frames in accordance with the present invention is shown. In this example, an MPE-FEC frame $14_{1,1}'$ has 6×1024 rows. Thus, the frame $14_{1,1}'$ can hold 12 Mbits of data. The MPE-FEC frame may have N×M rows, where N=2, 3, 4 or 5 and M=1024. N may have a value greater than 6. Furthermore, M need not be equal to 1024. For example, M may be equal to 64, 128, 192, 256, 320, 384, 448, 512, 576, 640, 704, 768, 832, 896 or 960. The MPE-FEC frame $14_{1,1}'$ is divided column-wise into six blocks $14_{1,1,1}''$, $14_{1,1,2}''$, $14_{1,1,3}''$, $14_{1,1,4}''$, $14_{1,1,5}''$, $14_{1,1,6}''$ which are transmitted in six respective bursts $19_1''$, $19_2''$, $19_3''$, $19_4''$, $19_5''$, $19_6''$. Each burst $19_1''$, $19_2''$, $19_3''$, $19_4''$, $19_5''$, $19_6''$ comprises 2 Mbits of data. This arrangement has an interleaving depth 68'. Thus, if a shot of noise affects one of the bursts, for example the second burst $19_2'$, then the data stands a better chance of being recovered using FEC. As will be explained in more detail later, to permit larger MPE-FEC frames, such as MPE-FEC frame $14_{1,1}'$, to be received, the mobile terminal (not shown) may include a larger time-slicing buffer 106 (FIG. 31).

Thus, increasing the size of the MPE-FEC frame and/or interleaving data from plural MPE-FEC frames helps to increase interleaving length and provide robustness against noise.

In the example described earlier, datagrams $28_1$, $28_2$ (FIG. 6) from two IP streams $9_1$, $9_2$ (FIG. 6) are transmitted in the one set of bursts $19_1$, $19_2$, $19_3$ (FIG. 19). The same level of coding is used for each IP stream $9_1$, $9_2$ (FIG. 6). In other words, the application data tables $32_1$, $32_2$ (FIG. 7) each have the same size and the RS data tables $33_1$, $33_2$ (FIG. 7) each have the same size.

However, different IP streams 9 may require different coding rates, i.e. different levels of coding. This may arise since IP streams 9 may need to be delivered with different priorities. IP streams encoded to different levels of coding take different amount of time and processing power to decode at a receiver.

Figure 23:
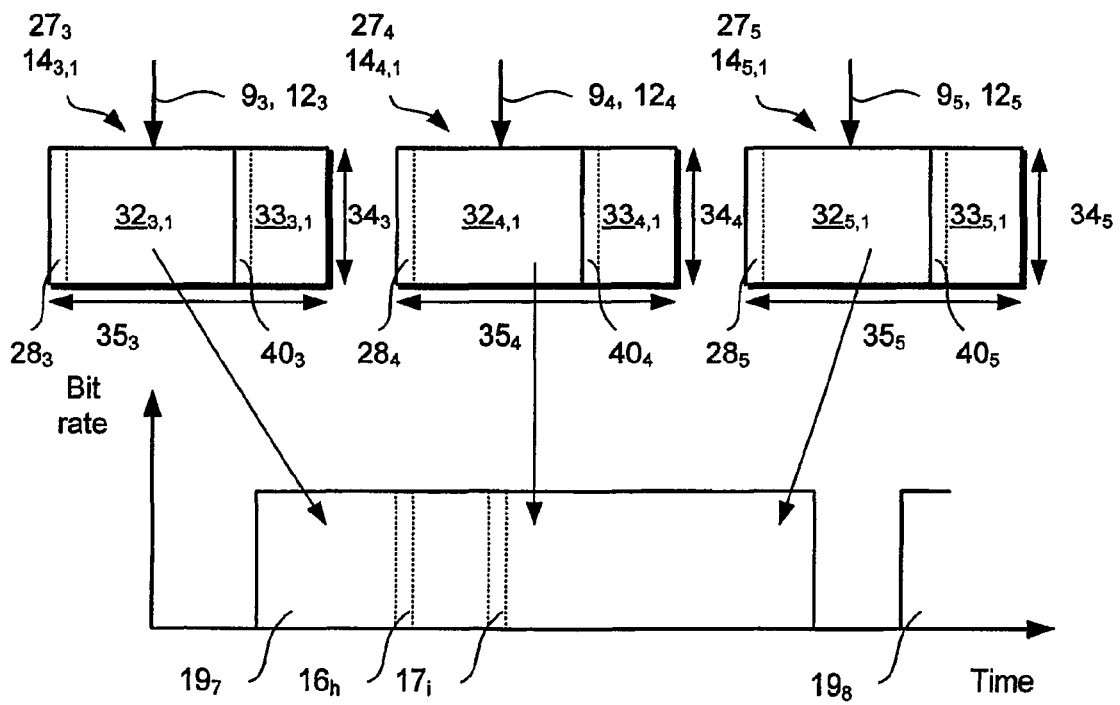
FIG. 23 illustrates inclusion of a plurality of MPE-FEC frames into one burst.

Referring to FIG. 23, the encoder 13 may be provided with third, fourth and fifth coding tables $27_3$, $27_4$, $27_5$ for third, fourth and fifth filtered streams $12_3$, $12_4$, $12_5$ respectively each comprising respective IP streams $9_3$, $9_4$, $9_5$. The coding tables $27_3$, $27_4$, $27_5$ comprise respective application data tables $32_3$, $32_4$, $32_5$ and RS data tables $33_3$, $33_4$, $33_5$.

For example, video data is transmitted in the third IP stream $9_3$, voice data is transmitted in the fourth IP stream $9_4$ and related data is transmitted in the fifth IP stream $9_5$. It is desired to transmit the video data with a low priority, the related data with a high priority and the voice data at an intermediate priority.

To achieve different priorities, different coding levels are used.

For example, the third coding table $27_3$ uses an RS (255, 239, 16) code, the fourth coding table $27_4$ uses an RS (255, 223, 32) and the fifth coding table $27_5$ uses an RS (255, 191, 64). Thus, the third application data table $32_3$ comprises 239 of 255 columns $34_3$, the fourth application data table $32_4$ comprises 223 of 255 columns $34_4$ and the fifth application data table $32_5$ comprises 191 of 255 columns $34_5$. Instead of using different codes, the coding rate can be decreased by puncturing a number of RS columns and increased by using padding in the application data table.

In this example, the third and fourth coding tables $27_3$, $27_4$ each comprise 384 rows $34_3$, $34_4$ and the fifth coding table $27_5$ comprises 256 rows $34_5$. Thus, three MPE-FEC frames $14_{3,1}$, $14_{4,1}$, $14_{5,1}$ can be transmitted in a single 2-Mbit burst $19_7$.

The coding tables $27_3$, $27_4$, $27_5$ may each have fewer or more columns $35_3$, $35_4$, $35_5$ and/or fewer or more rows $34_3$, $34_4$, $34_5$. A larger or smaller size of burst $19_7$ may be used. Nevertheless, it will be appreciated that amount of data which the coding tables $27_3$, $27_4$, $27_5$ can store should be equal to or less than the size of the burst $19_7$. Bursts larger than 2 Mbits may be used.

The coding tables $27_3$, $27_4$, $27_5$ are filled with datagrams $28_3$, $28_4$, $28_5$ and RS columns $40_3$, $40_4$, $40_5$ computed in a manner similar to that described earlier to produce MPE-FEC frames $14_{3,1}$, $14_{4,1}$, $14_{5,1}$ (steps S3 to S5).

The MPE-FEC frames $14_{3,1}$, $14_{4,1}$, $14_{5,1}$ are read out from the coding tables $27_3$, $27_4$, $27_5$ and the burst $19_7$ prepared in a manner similar to that described earlier. However, interleaving need not be used (steps S6 & S7).

Datagrams $28_3$, $28_4$, $28_5$ and RS columns $40_3$, $40_4$, $40_5$ are encapsulated (step S8). Frame identity and frame counter parameters 41, 42 (FIG. 13) are added to the headers of MPE sections $16_h$ and MPE-FEC sections $17_i$ (steps S9 & S10).

In the time slicing block 18 (FIG. 2), delta-t and burst parameters 62, 63 are added to the headers of MPE sections $16_h$ and MPE-FEC sections $17_i$ (steps S11 & 12) and the MPE sections $16_h$ and MPE-FEC sections $17_i$ are arranged into a single burst $19_7$ (step S13). In this case, the burst number parameter 63 (FIG. 18) can be set to burst_no=0. Delta-t is set to indicate arrival of the next burst $19_8$, which may comprise the next set of MPE-FEC frames (not shown), prepared using coding table $27_3$, $27_4$, $27_5$.

It will be appreciated that two, three or more MPE-FEC frames 14 can be transmitted in one burst 19 and that at least one of the MPE-FEC frames can have a different coding rate than other MPE-FEC frames.

Referring to FIG. 24 and FIGS. 25 to 27, a method of operating the transmitter will now be described.

Referring in particular to FIG. 25, the bursts 19 (FIG. 18) in the form of an intermittent stream of MPE sections 16, including MPE sections $16_1$, $16_2$, $16_3$, $16_4$, and MPE-FEC sections 17, including MPE-FEC sections $17_{f-2}$, $17_{f-1}$, is received by the TS stream generating and multiplexing block 23 (FIG. 2) and split into section fragments, including fragments $69_1$, $69_2$, $69_3$, $69_4$, $69_{g-1}$, $69_g$. Each fragment 69 is placed into a corresponding TS packet $25_A$. For example, fragments $69_1$, $69_2$, $69_3$, $69_4$, $69_{g-1}$, $69_g$ are placed into TS packets $25_{A,1}$, $25_{A,2}$, $25_{A,3}$, $25_{A,4}$, $25_{A,g-1}$, $25_{A,g}$ respectively.

Referring to FIG. 26, the TS packets $25_A$ are typically 188 bytes long and are compliant with ISO/IEC Standard 13818-1 "Information Technology-Generic coding of moving pictures and associated audio information: Systems". Each TS packet $25_A$ comprises a packet header 70 using a packet identifier (PID) 71. The packet identifier 70 can be used to identify contents of a TS packet payload 72.

The TS stream generating and multiplexing block 23 (FIG. 2) adds a PID corresponding to a set of bursts carrying MPE sections 16 and MPE-FEC sections 17 for the same filtered stream 12 or set of filtered streams 12 (FIG. 2).

Referring to FIG. 27, the TS stream generating and multiplexing block 23 (FIG. 2) multiplexes the TS packets $25_A$ carrying MPE sections 16 and MPE-FEC sections 17 with TS packets $25_B$ carrying SI and PSI tables sections 22 (FIG. 2) and TS packets $25_C$ carrying one or more MPEG-2 TV services 24 (FIG. 2) into a common multiplex 25. The SI/PSI table sections 21 (FIG. 2) and MPEG-2 TV services 24 (FIG. 2) are not time sliced. The multiplex 25 is forwarded to the modulating block 26 for modulation, amplification and transmission as an r.f. signal 8 (FIG. 1).

Referring to FIG. 2, the MPE encapsulator 6 receives service information data 10 which is used to prepare SI and PSI/SI and SI data, including an IP/MAC Notification Table (INT) (not shown), and transmits the data 21 to receivers (not shown) including the mobile terminal 2 (FIG. 1).

The SI/PSI section encapsulating block 20 (FIG. 2) segments the INT (not shown) into sections (not shown) and passes the table sections to the TS stream generator and multiplexing means 24 to be mapped into TS packets $25_B$ having PID=0x004C and multiplexed into the multiplex 25 (FIG. 2). The INT is described in more detail in Clause 7.6 of EN 301 192 ibid.

As briefly mentioned earlier, a data broadcast descriptor in a Service Description Table (SDT) transmitted using service description sections indicates that first, second, third and fourth MAC address fields are used to carry real time parameters, such as delta-t. A broadcast descriptor may indicate that the fifth MAC address field and reserved fields are to be used to carry parameters such a frame identity, frame counter and burst number. The service description sections and data broadcast descriptor are described in more detail in Clauses 6 and 7 of EN 300 468 ibid.

Figure 28:
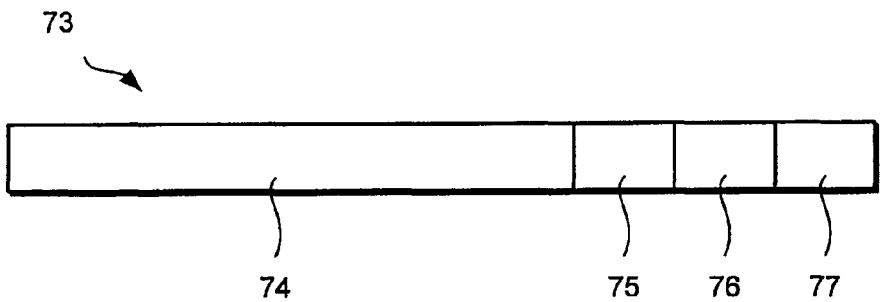
FIG. 28 is a schematic diagram of a time slice and FEC identifier descriptor.

Referring to FIG. 28, a time slice and FEC identifier descriptor 73 is used to signal information about MPE-FEC and time slicing for a given elementary stream.

The descriptor 73 is similar to a time slice and FEC identifier descriptor 74 described in Clause 9.5 of EN 301 192 ibid. which identifies whether time slicing and/or MPE-FEC is used on a given elementary stream. However, the descriptor 73 includes additional fields including a field 75 for indicating the number of bursts used to transmit a single MPE-FEC frame, a field 76 for indicating the size of MPE-FEC frame and a field 77 for indicating the number of MPE-FEC frames carried in a single burst. The version number, the type of coding, especially if other than RS (255,191,64), and the maximum frame size, especially if other than maximum burst size, may also be indicated.

Figure 29:
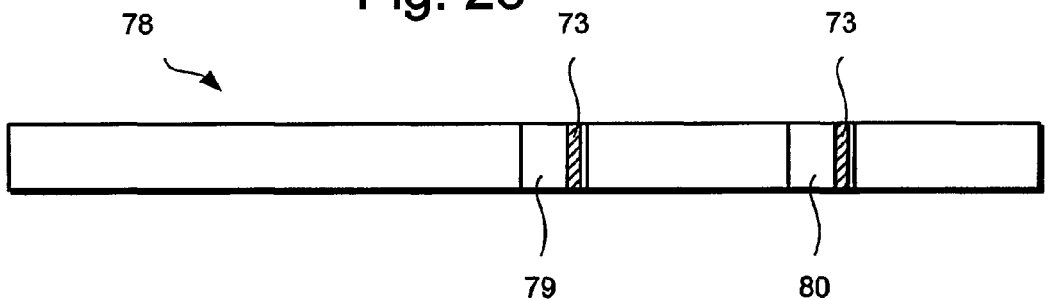
FIG. 29 is a schematic diagram of a network information table (NIT)

Referring to FIG. 29, the time slice identifier descriptor 73 is used in a network information table (NIT) 78 having first and second descriptor loops 79, 80.

When located in a first descriptor loop 79, the descriptor 73 applies to all transport streams announced within the table 78. The descriptor 73 applies to all elementary streams having a given stream type field value on any of the transport streams. A stream type field value of 0x0D may be used for elementary streams carrying MPE only streams. A stream type field value of 0x80 may be used for elementary streams carrying MPE and FEC sections. A stream_type field value of between 0x80 and 0xFF may be used for elementary streams carrying only FEC section.

When located in a second descriptor loop 80, the descriptor 73 applies to the transport stream in question, specified in a transport stream field (not shown). The descriptor 73 applies to all elementary streams having a given stream type field value. This descriptor 73 overwrites possible descriptors in the first descriptor loop.

The descriptor 73 may be included in other types of tables, such as in the INT (not shown).

When located in the platform descriptor loop (not shown) of the INT (not shown), the descriptor applies to all elementary streams referred to within the table. This descriptor overwrites possible descriptors in NIT.

When located in the target descriptor loop (not shown) of the INT (not shown), the descriptor applies to all elementary streams referred within the target descriptor loop (not shown) in question after the appearance of the descriptor. This descriptor overwrites possible descriptors in the platform descriptor loop and in NIT. In case an elementary stream is referred from multiple locations within an INT, each contains the same signalling.

The SI/PSI section encapsulating block 20 (FIG. 2) segments the NIT 78 into sections (not shown) and passes the sections to the TS stream generator and multiplexing block 24 to be mapped into TS packets $26_B$ having PID=0x0010 and multiplexed into the multiplex 26 (FIG. 2).

A receiver usually only accesses the NIT 78 when connecting to the network 1 (FIG. 1).

A receiver (not shown) may need to read the content of an INT when changing from one transport stream to another (not shown) and usually not more than once. Changes in the INT can be signalled in PSI using a PMT table (not shown), thus ensuring that constant filtering of the INT is not required.

PSI tables, such as PMT (not shown), are usually re-transmitted at least once in every 100 ms. If the duration of a burst is longer than 100 ms, a receiver has access to PMT while receiving a burst. For shorter bursts, a receiver may choose to keep switched on until all required PSI tables are received.

Mobile Terminal 2

Figure 30:
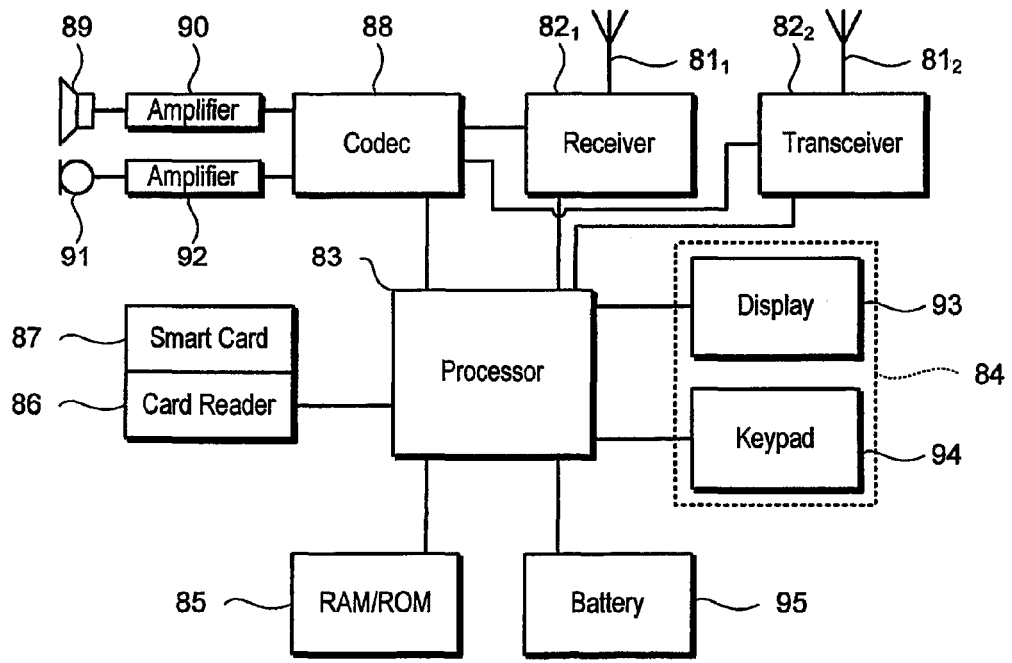
FIG. 30 is a schematic diagram of a mobile terminal.

Referring to FIG. 30, a mobile terminal 2 for receiving content from the digital broadcasting network 1 (FIG. 1) is shown.

The mobile terminal 2 is in the form of a mobile telephone handset having a multimedia capability. The mobile terminal 2 includes first and second antennas $81_1$, $81_2$, a receiver $82_1$ and a transceiver $82_2$. In this example, the first antenna $81_1$ and receiver $82_1$ are used to receive signals from the broadcasting network 1 (FIG. 1). The second antenna $81_2$ and transceiver $82_2$ are used to transmit and receive signals to and from a second communications network (not shown), such as a PLMN. The receiver and transceiver $81_1$, $82_2$ each include respective r.f. signal processing circuits (not shown) for amplifying and demodulating received signals and respective processors (not shown) for channel decoding and demultiplexing.

The mobile terminal 2 also includes a processor 83, a user interface 84, memory 85, an optional smart card reader 86, an optional smart card 87 received in the smart card reader 86, a coder/decoder (codec) 88, a speaker 89 with corresponding amplifier 90 and a microphone 91 with a corresponding pre-amplifier 92.

The user interface 84 comprises a display 93 and a keypad 94. The display 93 is adapted for displaying images and video by, for instance, being larger and/or having greater resolution than a display of conventional mobile telephone and being capable of color images. The mobile terminal 2 also includes a battery 95.

The processor 83 manages operation of the mobile terminal 2 under the direction of computer software (not shown) stored in memory 85. For example, the controller 83 provides an output for the display 93 and receives inputs from the keypad 94.

The mobile terminal 2 may be modified providing a single receiver adapted to receive signals from the broadcasting network 1 (FIG. 1) and the second communications network (not shown) and a transmitter adapted to transmit signals to the second communications network (not shown). Alternatively, a single transceiver for both communications networks may be provided.

Referring to FIG. 31, the receiver $82_1$ includes a demodulator 96 for demodulating r.f. signal 8 and outputting TS packets 26 for processing by the processor 83. However, processing need not be performed by processor 83 but may be performed within the receiver $82_1$ or by a dedicated digital signal processor (not shown). The processes performed by the processor 83 are illustrated as a functional block diagram in FIG. 31.

A TS filtering block 97 receives the TS stream 25', filters TS packets $25_A$, $25_B$ according to PID values 71 (FIG. 26) held in the TS packet header 70 (FIG. 26) and passes the filtered TS packets $25_A$, $25_B$ to a section parsing block 98. TS packets $25_C$ carrying MPEG-2 TV can also be filtered and processed in a conventional manner.

The section parsing block 98 decapsulates the payload 72 (FIG. 26) of the TS packets $25_A$, $25_B$ and outputs MPE sections 16, MPE-FEC sections 17 and SI/PSI table sections 22. The table sections 21 include sections (not shown) carrying NIT 78 (FIG. 29) and INT (not shown).

When the mobile terminal 2 is switched on by the user, the TS filtering block 97 may not know the PID values for TS packets $25_A$ carrying the filtered streams 12 providing the service(s) which the user wishes to consume. Thus, initially, the TS filtering block 97 may only receive and filter TS packets $25_B$ carrying the NIT 78 (FIG. 29) and INT (not shown) which are used for services discovery, for example as described in EN 301 192 ibid. The user is presented with an electronic service guide (not shown) from which he or she can select a service. The processor 83 (FIG. 30) looks up the PID for the selected service in the NIT 78 (FIG. 29) or INT (not shown) and provide the PID to the TS filtering block 97 so as to filter TS packets $25_A$.

The section decapsulating block 99 extracts real time parameters, frame_id and frame_counter parameters from the headers 46, 49 (FIGS. 13 & 14) of MPE and MPE-FEC sections 16, 17 and provides them to a controller block 100.

The section decapsulating block 99 extracts datagrams and RS columns from payloads 47, 50 (FIGS. 13 & 14) of MPE and MPE-FEC sections 16, 17 and SI/PSI table sections 21 and forwards them to an MPE-FEC decoding block 102 and an PSI/SI parser 103 respectively. The section decapsulating block 99 also forwards address 43 (FIG. 13) to an MPE-FEC decoding block 102.

The controller block 100 analyzes real time parameters and generates a control signal 104 for instructing the receiver $82_1$ to switch off or conserve power. The controller block 100 may also generate other control signals (not shown) to instruct other processing blocks to switch off or conserve power.

The controller block 100 also analyzes the teal time parameters and generates a control signal 105 for instructing the MPE-FEC decoding block 102 to begin decoding if an end of a burst is lost.

The MPE-FEC decoding block 102 includes one or more decoding tables 106. As will be explained in more detail later, the number and size of the decoding tables 106 may be determined based on the MPE-FEC frame arrangement.

The MPE-FEC decoding block 102 outputs filtered streams 12 to an IP parsing and filtering block 107 filtering IP streams 9 according to IP address.

Referring to FIGS. 30, 31, 32A and 32B, a method of operating the mobile terminal 2 will now be described.

Figure 32A:
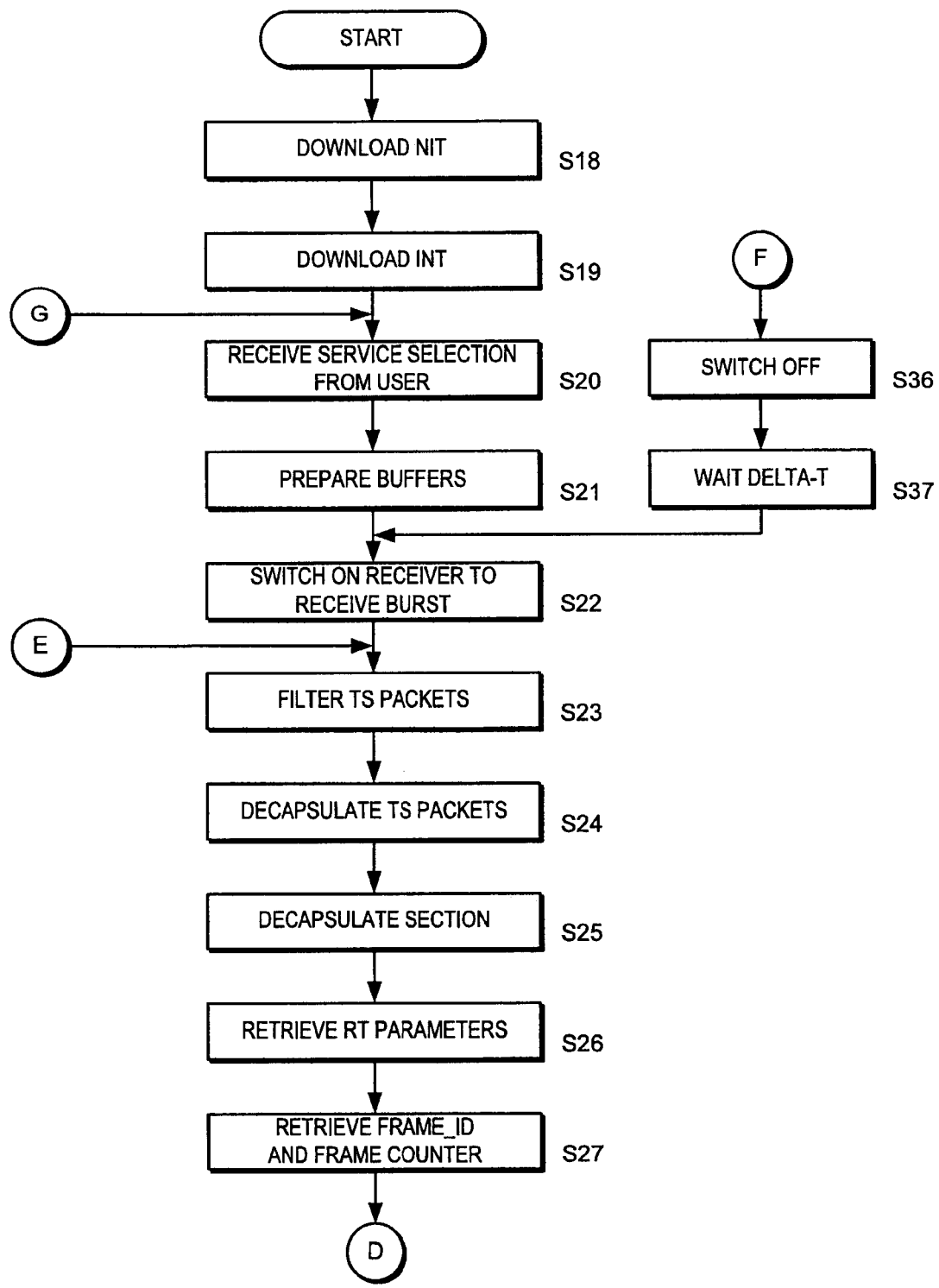
FIG. 32A and FIG. 32B show a process flow diagram of a method of operating the mobile telephone shown in FIG. 30 in accordance with the present invention.
Figure 32B:
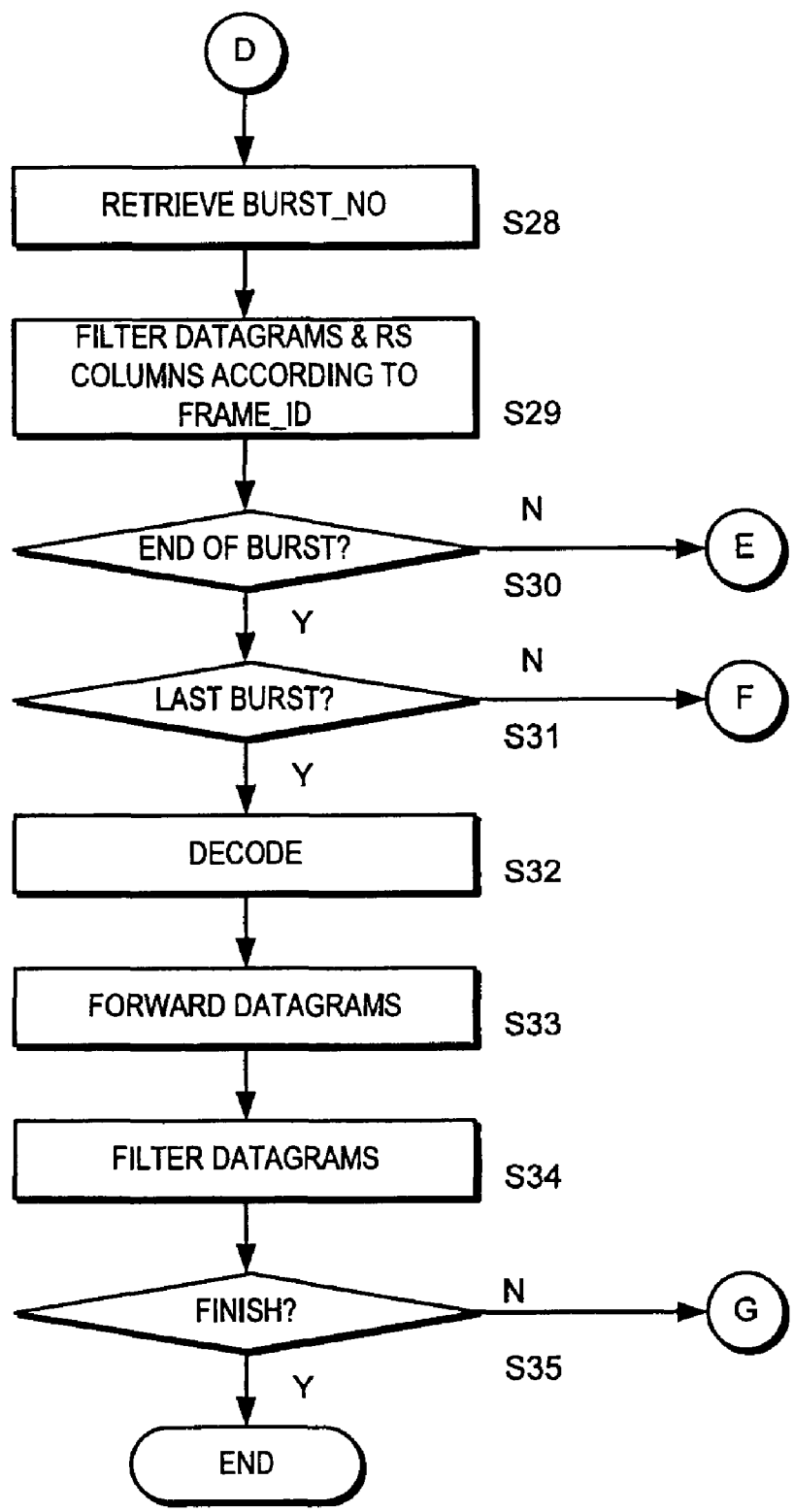

When the mobile terminal 2 is switched on by the user or at another convenient time, the processor 83 downloads NIT 78 (FIG. 29) and INT (not shown) and stores them in memory 85 (steps S18 & S19 in FIG. 32A).

Using the NIT (FIG. 29) and INT (not shown), appropriate SI tables (not shown) can be downloaded as-and-when required so as to provide an electronic service guide (ESG) (not shown). A mobile terminal user (not shown) can browse the ESG via display 93 and select a service using keypad 94 (step S19).

The user wishes to consume the service provided by filtered streams $12_1$, $12_2$ (FIG. 4).

Once a service has been selected, the processor 83 searches for the network NIT 78 stored in memory 85 for the corresponding time slice and FEC identifier descriptor 73. The processor 83 examines the time slicing, MPE FEC, maximum burst duration, maximum average rate, burst size and frame size and time slice identity fields (not shown) of the descriptor 73 to determine whether time slicing and MPE-FEC is used and, if so, to acquire time slicing and MPE-FEC parameters. Additionally, the processor 83 examines burst number field 75, frame size field 76 MPE-FEC frame number field 77 and burst size field to determine the number of bursts used to transmit a single MPE-FEC frame, the size of MPE-FEC frame and the number of MPE-FEC frames carried in a single burst. These parameters are passed to the TS filtering block 97, section demultiplexer 99 and MPE-FEC decoding block 102.

Figure 33:
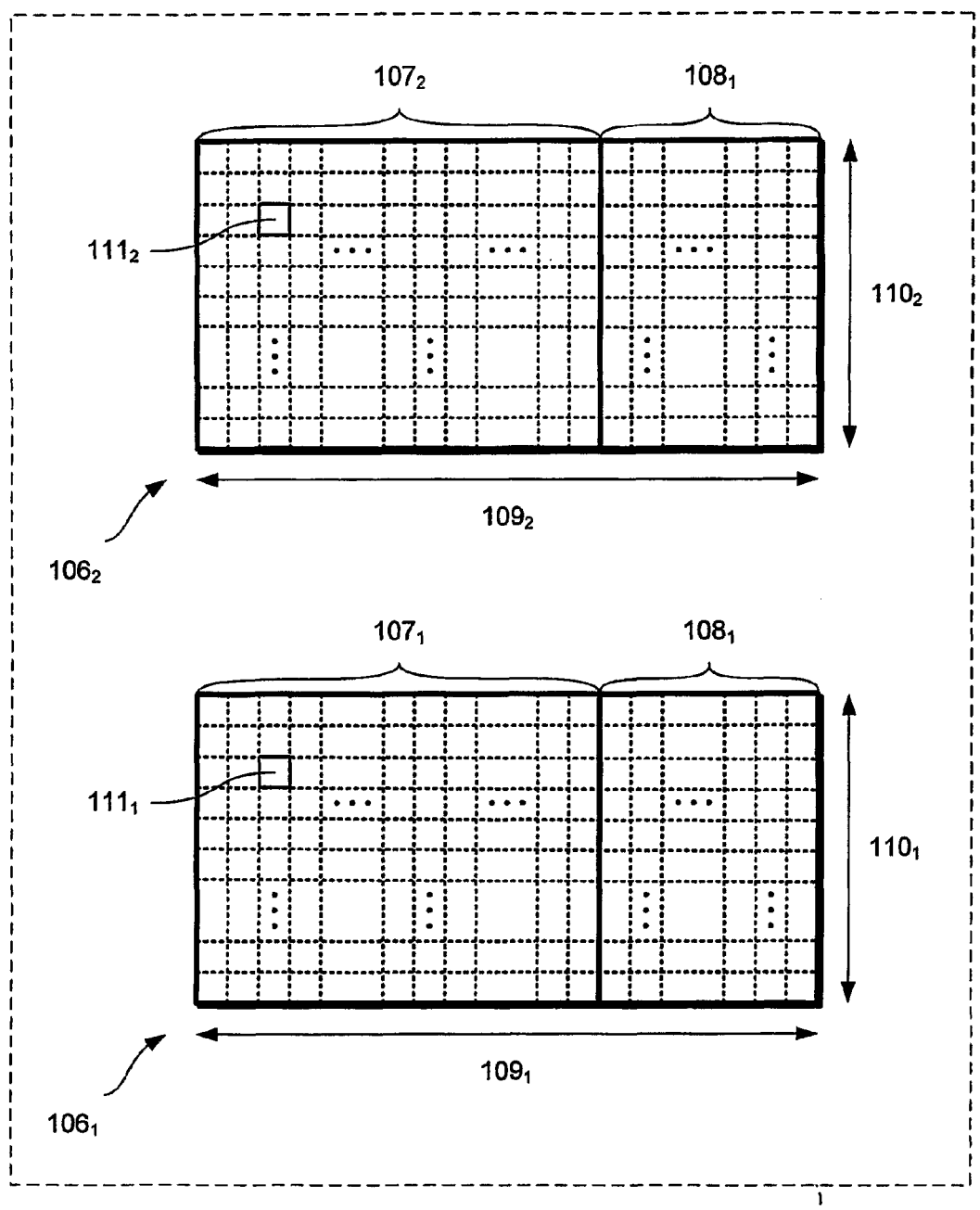
FIG. 33 illustrates decoding tables in a time slice buffer.

Referring to FIG. 33, the MPE-FEC decoding block 102 prepares buffers 106, in this example first and second buffers $106_1$, $106_2$ which correspond to the first and second coding tables $27_1$, $27_2$ (FIG. 7) and comprise respective application data tables $107_1$, $107_2$, RS data tables $108_1$, $108_2$ and have 255 columns $109_1$, $109_2$ and 1024 rows $110_1$, $110_2$, each position $111_1$, $111_2$ within the buffers $106_1$, $106_2$ holding a byte of data (step S21). Preparing buffers 106 may comprise allocating parts of a single buffer having a size L×2 Mbit, where L>1, to a given MPE-FEC frame.

If the receiver $82_1$ is not already switched on, the controller 100 instructs the receiver $82_1$ to switch on (step S22).

The receiver $82_1$ demodulates the signal 8 and outputs TS stream 25'. The TS stream 25' comprises at least part of the multiplex 25 (FIG. 27).

The TS filtering block 97 filters TS packets $25_A$ (FIG. 25) according to the PID 71 (FIG. 26) (step S23). The TS filtering block 97 may discard any TS packets $25_A$ containing errors.

The section parsing block 98 receives the TS packets $25_A$, decapsulates section fragments 69 (FIG. 25) from the TS packets $25_A$ and outputs MPE sections 16 and MPE-FEC sections 17, for example similar to those shown in FIG. 17 (step S24).

Figure 34:
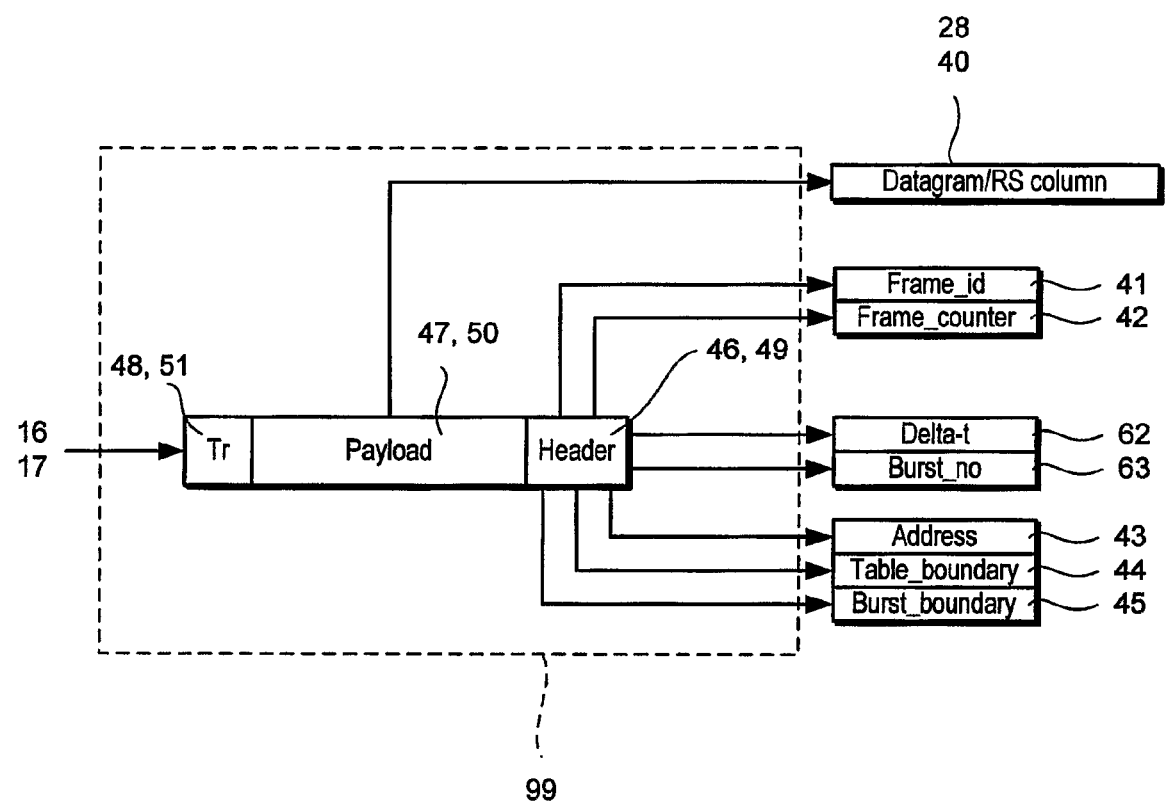
FIG. 34 illustrates decapsulating an MPE or MPE-FEC section.

Referring also to FIG. 34, the section decapsulating block 99 receives the MPE sections 16 and MPE-FEC sections 17, decapsulates the datagrams 28 and RS columns 40 from their payloads 47, 50 from the MPE and MPE-FEC sections 16, 17 (step S25) and extracts real time parameters including address (step S26), frame identity and frame counter parameters (step S27) and burst number (step S28 of FIG. 32B) from the headers 46, 49.

Figure 35:
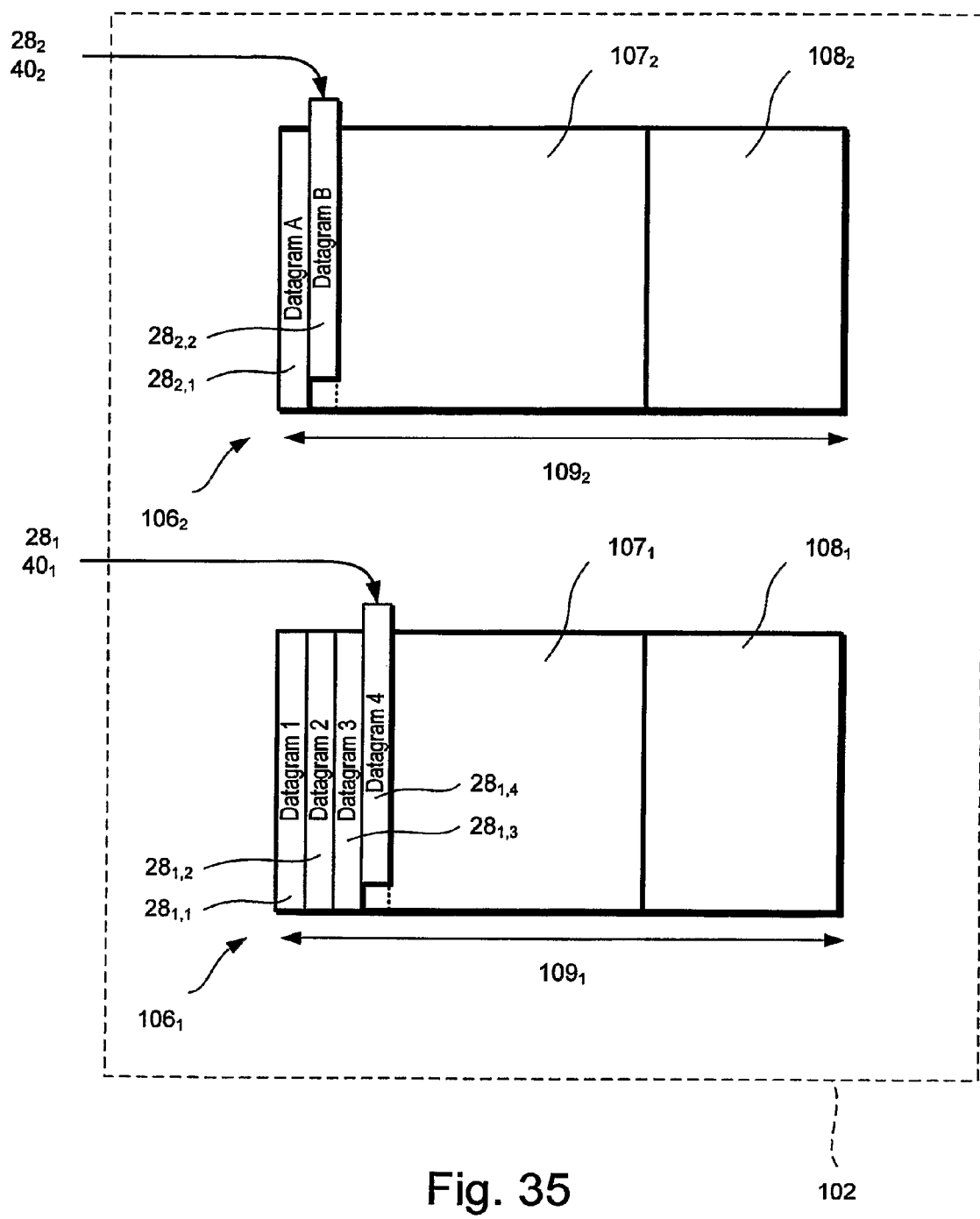
FIG. 35; illustrates filling the decoding tables with payload of MPE and MPE-FEC sections.

Referring to FIG. 35, the MPE-FEC decoding block 102 receives datagrams $28_1$, $28_2$, for example including datagrams $28_{1,1}$, $28_{1,2}$, $28_{2,1}$, $28_{2,2}$, $28_{2,3}$, $28_{2,4}$, and RS columns $40_1$, $40_2$, together with corresponding frame identity and frame counter parameter 41, 42, address data 43, table flag 44, burst end flag 45, and burst counter 60.

Based on the frame identity parameter 41, the MPE-FEC decoding block 106 channels datagrams 28 and RS columns 40 to the first and second buffers $106_1$, $106_2$ and places them in the first and second buffers $106_1$, $106_2$ according to the address data 43 (step S29).

The MPE-FEC decoding block 102 checks whether the end of the burst has been reached (step S30). This comprises checking the burst end field in the real time parameter field 54, 59 (FIGS. 15 & 16) and determining whether the burst end field is equal to '1', where '1' indicates end of the burst. If the end of the burst has not been reached, then processing of TS packets $25_A$ and sections 16, 17 continues (steps S23 to S30).

If the end of the burst is reached, then the MPE-FEC decoding block 102 checks whether further bursts carrying more data from the same MPE-FEC frame are expected (step S31). This comprises checking the burst counter 60 and determining whether the burst counter is equal to '0'. This can also be used to check whether a burst is a single burst comprises plural whole MPE-FEC frames.

Figure 36:
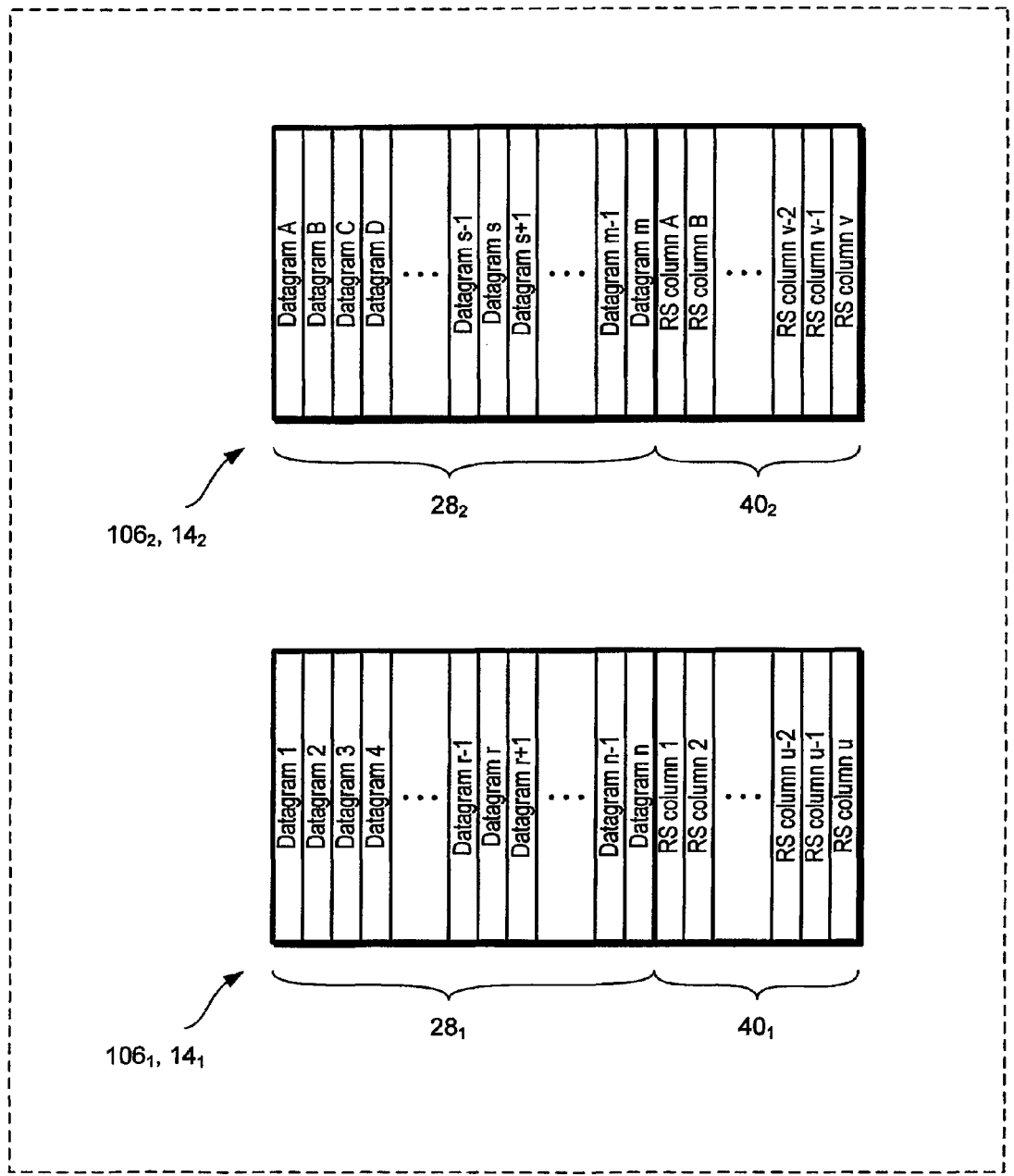
FIG. 36 illustrates complete decoding tables.

Referring to FIG. 36, if no further bursts carrying more data from the same MPE-FEC frame are expected whether because the burst is the last in a series carrying one or more MPE-FEC frames or whether the burst comprises plural whole MPE-FEC frames, then the or each MPE-FEC frame $14_1$, $14_2$ can be assumed to have been received.

The MPE-FEC decoding block 102 need not receive or may ignore RS columns $40_1$, $40_2$.

Figure 37:
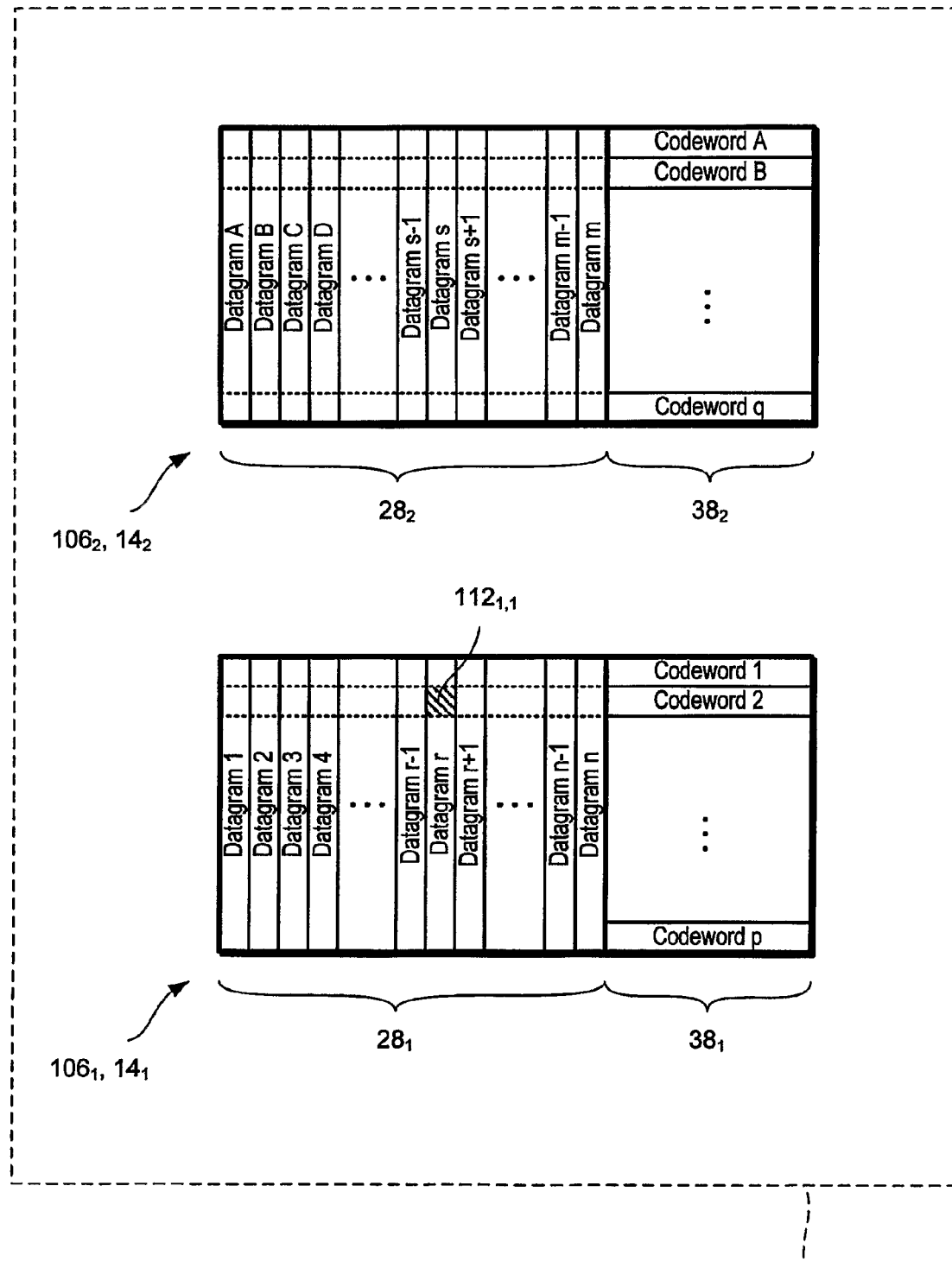
FIG. 37 illustrates error correction.

Referring to FIG. 37, MPE-FEC decoding block 102 decodes the or each MPE-FEC frame $14_1$, $14_2$ (step S31). This comprises using RS codewords $38_1$, $38_2$ to check for and correct errors, such as erroneous byte $112_{1,1}$.

The MPE-FEC decoding block 102 need not decode the or each MPE-FEC frame $14_1$, $14_2$.

MPE-FEC decoding block 102 reads out datagrams $28_1$, $28_2$ from the buffer $106_1$, $106_2$ (step S33).

The filtering block 107 filters datagrams $28_1$, $28_2$ according to their IP address and passes them on to an application (not shown) or memory for storage, further processing, rendering or other use (step S33). If the service has been delivered or is no longer required, then reception and processing of TS packets $25_A$ for the service can cease (step S35).

If further bursts are expected, then the controller 100 instructs the receiver $82_1$ to switch off (step S36), waits delta-t (step S37), preferably using the value received in the last section of the burst and instructs the receiver $82_1$ to switch on to receive the next burst (step S22).

Figure 38:
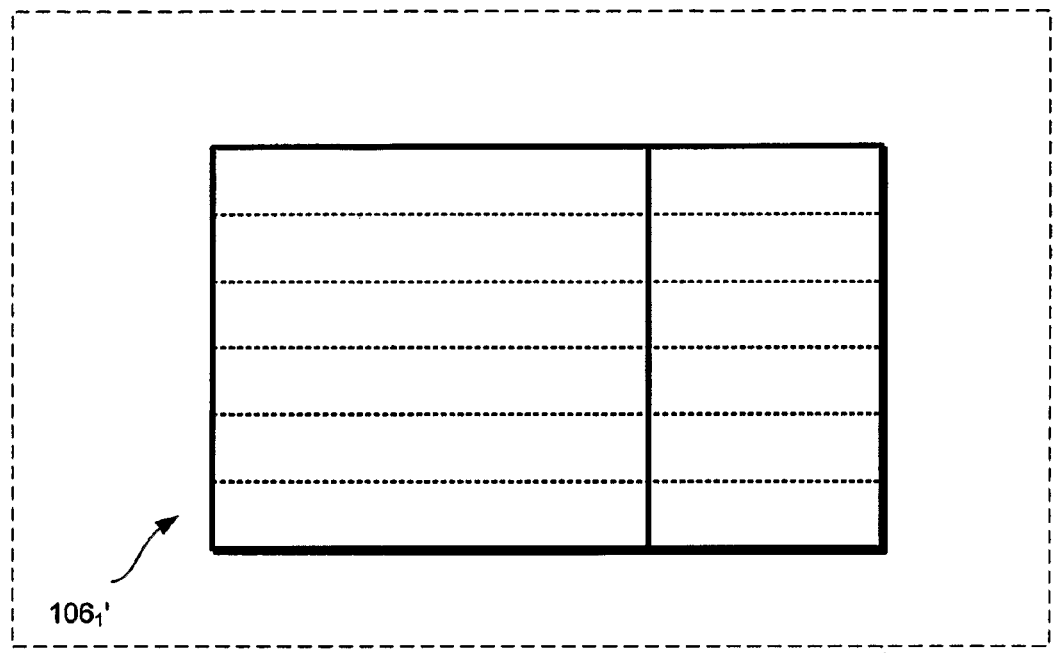
FIG. 38 illustrates another example of a decoding table.

Referring to FIG. 38, if an MPE-FEC frame larger than 2 Mbits is to be received, for example MPE-FEC frame $14_{1,1}'$ (FIG. 22), then the decoding table $106_1'$ which is larger than a conventional time-slicing buffer, in other words larger than 2 Mbits, can be prepared.

Figure 39:
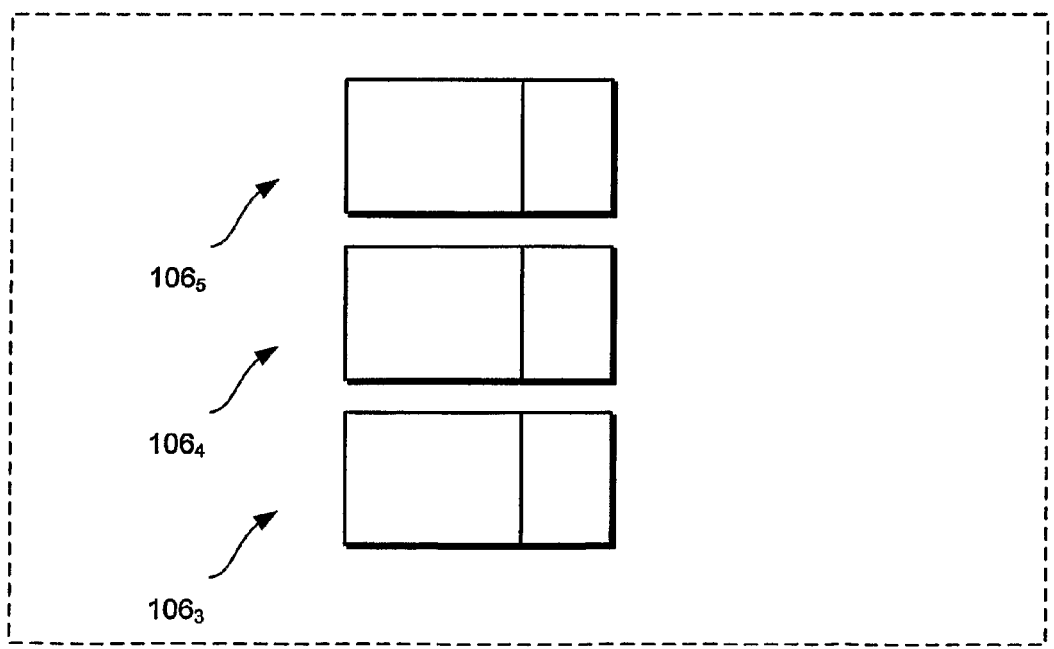
FIG. 39 illustrates further examples of decoding tables.

Referring to FIG. 39, if plural MPE-FEC frames are to be received in a single burst, for MPE-FEC frame $14_{3,1}$, $14_{4,1}$, $14_{5,1}$, then respective decoding tables $106_3$, $106_4$, $106_5$ can be prepared.

It will be appreciated that many modifications may be made to the embodiments hereinbefore described. For example, the mobile terminal 2 may be a personal data assistant (PDA) or other mobile terminal capable of at least of receiving signals via the first communications network 1. The mobile terminal may also be semi-fixed or semi-portable such as a terminal carried in vehicle, such as a car.

The invention claimed is:

1. A method comprising: providing a first data frame, the data frame comprising a first set of data and a corresponding first set of forward error correction data; forming a sequence of transmissions for transmission in a digital broadcasting network; and dividing the first data frame between said transmissions, the first set of data being divided between at least two transmissions.

2. A method according to claim 1, wherein at least one transmission does not include forward error correction data.

3. A method according to claim 1, further comprising: providing a second data frame, the second data frame comprising a second set of data and a corresponding second set of forward error correction data; and dividing the second data and the second set of forward error correction data in the second data frame between the plurality of transmissions.

4. A method according to claim 3, comprising: dividing the first data frame into a first set of data frame blocks; dividing the second data frame into a second set of data frame blocks; interleaving the first and second sets of data frame blocks; and sequentially placing the interleaved data frame blocks into the plurality of transmissions.

5. A method according to claim 1, further comprising: providing each data frame with a respective label for identifying an origin of the data.

6. A method according to claim 1, further comprising: providing each data frame with a respective label for locating the data frame in a sequence of data frames.

7. A method according to claim 1, further comprising: providing each transmission with a respective label for identifying the transmission within the plurality of transmissions.

8. A method according to claim 1, wherein providing the first data frame comprises: providing a first array comprising first and second portions; filling at least a part of the first array-portion with the first set of data; determining the first set of forward error correction data in dependence upon data in the first array-portion; and placing said first set of forward error correction data in the second array-portion.

9. A method according to claim 1, comprising: encapsulating the first set of data into a first set of multiprotocol encapsulation sections; and encapsulating said corresponding forward error correction data into a second set of multiprotocol encapsulation sections.

10. A method according to claim 9, wherein forming said plurality of transmissions comprises: arranging said first and second sets of multiprotocol encapsulation sections temporally-offset groups.

11. A method according to claim 1, wherein said first data frame is a multiprotocol encapsulation-forward error correction frame.

12. A method according claim 1, wherein said digital broadcasting network is a digital video broadcasting network.

13. A computer program comprising a computer readable medium having instructions stored thereon for causing data processing apparatus to perform the method of claim 1.

14. Apparatus, comprising
a processor; and
memory including computer software, the memory and the computer software configured to, with the processor, cause the apparatus at least to perform the method of claim 1.

15. Apparatus according to claim 14, which is a multiprotocol encapsulation encapsulator.

16. A method according to claim 1 wherein the transmissions are bursts.

17. A method comprising: providing a first data frame, said first data frame comprising a first set of data and a corresponding first set of forward error correction data; providing a second data frame, said second data frame comprising a second set of data and a corresponding second set of forward error correction data; and forming a transmission comprising said first and second data frames for transmission in a digital broadcasting network.

18. A computer program comprising a computer readable medium having instructions stored thereon for causing data processing apparatus to perform the method of claim 17.

19. Apparatus, comprising
a processor; and
memory including computer software, the memory and the computer software configured to, with the processor, cause the apparatus at least to perform the method of claim 17.

20. A method according to claim 17 wherein the transmission is a burst.

21. A method comprising: receiving a first transmission from a digital broadcasting network, said transmission including data for a data frame; placing said data in a data frame; extracting, from said first transmission, an indication that a second transmission in a sequence of transmissions which includes said first transmission follow; receiving said second transmission from the digital broadcasting network, said second transmission including further data for said data frame; and placing said further data in said data frame.

22. A computer program comprising a computer readable medium having instructions stored thereon for causing data processing apparatus to perform the method of claim 21.

23. Apparatus, comprising
a processor; and
memory including computer software, the memory and the computer software configured to, with the processor, cause the apparatus at least to perform the method of claim 21.

24. A method according to claim 21 wherein the first and second transmissions are respectively first and second bursts.

25. A method comprising: receiving a transmission from a digital broadcasting network, said transmission including data for a plurality of data frames; extracting sets of data from said transmission together with indications to which data frame said sets of data belong; and placing each set of data in a corresponding data frame.

26. A computer program comprising a computer readable medium having instructions stored thereon for causing data processing apparatus to perform the method of claim 25.

27. A computer program according to claim 26 stored on a data carrier.

28. Apparatus, comprising a processor; and memory including computer software, the memory and the computer software configured to, with the processor, cause the apparatus at least to perform the method of claim 25.

29. A method according to claim 25 wherein the transmission is a burst.

* * * * *